(12) United States Patent
Cheng et al.

(10) Patent No.: US 9,577,100 B2
(45) Date of Patent: Feb. 21, 2017

(54) FINFET AND NANOWIRE SEMICONDUCTOR DEVICES WITH SUSPENDED CHANNEL REGIONS AND GATE STRUCTURES SURROUNDING THE SUSPENDED CHANNEL REGIONS

(71) Applicant: GLOBALFOUNDRIES INC., Grand Cayman (KY)

(72) Inventors: Kangguo Cheng, Schenectady, NY (US); Michael P. Chudzik, Danbury, CT (US); Eric C. Harley, Lagrangeville, NY (US); Judson R. Holt, Wappingers Falls, NY (US); Yue Ke, Fishkill, NY (US); Rishikesh Krishnan, Painted Post, NY (US); Kern Rim, Yorktown Heights, NY (US); Henry K. Utomo, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 157 days.

(21) Appl. No.: 14/305,543

(22) Filed: Jun. 16, 2014

(65) Prior Publication Data
US 2015/0364603 A1 Dec. 17, 2015

(51) Int. Cl.
| | |
|---|---|
| H01L 27/12 | (2006.01) |
| H01L 29/78 | (2006.01) |
| H01L 29/66 | (2006.01) |
| H01L 29/161 | (2006.01) |
| H01L 29/10 | (2006.01) |
| B82Y 10/00 | (2011.01) |
| H01L 29/423 | (2006.01) |
| H01L 29/775 | (2006.01) |
| H01L 29/06 | (2006.01) |
| H01L 21/306 | (2006.01) |
| H01L 29/165 | (2006.01) |

(52) U.S. Cl.
CPC .......... *H01L 29/7851* (2013.01); *B82Y 10/00* (2013.01); *H01L 29/0673* (2013.01); *H01L 29/1037* (2013.01); *H01L 29/161* (2013.01); *H01L 29/42376* (2013.01); *H01L 29/6681* (2013.01); *H01L 29/66439* (2013.01); *H01L 29/775* (2013.01); *H01L 29/7848* (2013.01); *H01L 21/30604* (2013.01); *H01L 29/165* (2013.01)

(58) Field of Classification Search
CPC .................................................. H01L 29/785
USPC .......................................... 257/347; 438/283
See application file for complete search history.

(56) References Cited

U.S. PATENT DOCUMENTS

| | | | |
|---|---|---|---|
| 7,341,902 B2 | 3/2008 | Anderson et al. | |
| 7,820,513 B2 * | 10/2010 | Hareland | ......... H01L 29/42384 257/E21.415 |
| 8,415,209 B2 | 4/2013 | Rooyackers et al. | |

(Continued)

*Primary Examiner* — David Vu
*Assistant Examiner* — Brandon Fox
(74) *Attorney, Agent, or Firm* — Hoffman Warnick LLC

(57) ABSTRACT

A semiconductor device including at least one suspended channel structure of a silicon including material, and a gate structure present on the suspended channel structure. At least one gate dielectric layer is present surrounding the suspended channel structure, and at least one gate conductor is present on the at least one gate dielectric layer. Source and drain structures may be composed of a silicon and germanium including material. The source and drain structures are in contact with the source and drain region ends of the suspended channel structure through a silicon cladding layer.

13 Claims, 16 Drawing Sheets

(56) References Cited

U.S. PATENT DOCUMENTS

| | | | |
|---|---|---|---|
| 8,816,428 B1* | 8/2014 | Miller | H01L 21/762 257/329 |
| 9,224,810 B2* | 12/2015 | Kim | H01L 27/092 |
| 2011/0241073 A1 | 10/2011 | Cohen et al. | |
| 2012/0138886 A1* | 6/2012 | Kuhn | B82Y 10/00 257/9 |
| 2013/0048994 A1 | 2/2013 | Choi et al. | |
| 2013/0105897 A1 | 5/2013 | Bangsaruntip et al. | |
| 2013/0119479 A1 | 5/2013 | Hung et al. | |
| 2013/0149830 A1 | 6/2013 | Rhee et al. | |
| 2015/0008484 A1* | 1/2015 | Cea | H01L 29/66545 257/192 |

* cited by examiner

FINFET AND NANOWIRE SEMICONDUCTOR DEVICES WITH SUSPENDED CHANNEL REGIONS AND GATE STRUCTURES SURROUNDING THE SUSPENDED CHANNEL REGIONS

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. Examples of such classes of devices include a fin field effect transistor (finFET) and nanowire semiconductor devices.

SUMMARY

In one aspect, a method is disclosed for forming a semiconductor device. In one embodiment, the method includes forming at least one sacrificial gate structure on a channel region portion of at least one fin structure. The at least one fin structure is a layered stack including at least one second semiconductor layer atop at least one first semiconductor layer that is atop a semiconductor base layer. The exposed portions of the at least one fin structure are then etched. A semiconductor cladding layer is formed on sidewalls of a remaining portion of the at least one fin structure. Source and drain merge structures are formed in contact with the remaining portion of the at least one fin structure. The at least one sacrificial gate structure can then be removed. The at least one first semiconductor layer of the fin structure is then removed selectively to the semiconductor cladding layer. A functional gate structure is formed in the space that is provided by removing the at least one sacrificial gate structure. The at least one second semiconductor layer of the fin structure provides a channel region that is surrounded by the functional gate structure.

In another aspect, a semiconductor device is provided that includes a gate structure present on at least one suspended channel structure. The gate structure may include at least one gate dielectric layer that is present surrounding the at least one suspended channel structure and at least one gate conductor that is present on the at least one gate dielectric layer. The source and drain structures may be composed of a strain inducing semiconductor material. The source and drain structures may be in contact with the source and drain region ends of the suspended channel structure through a semiconductor cladding layer.

In another embodiment, the semiconductor device includes a gate structure present on at least one nanowire structure. The gate structure typically includes at least one gate dielectric layer that is present surrounding the at least one nanowire structure and at least one gate conductor is present on the at least one gate dielectric layer. Source and drain merge structures comprised of a strain inducing material are in contact with the source and drain region ends of the at least one nanowire structure through a semiconductor cladding layer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1A:
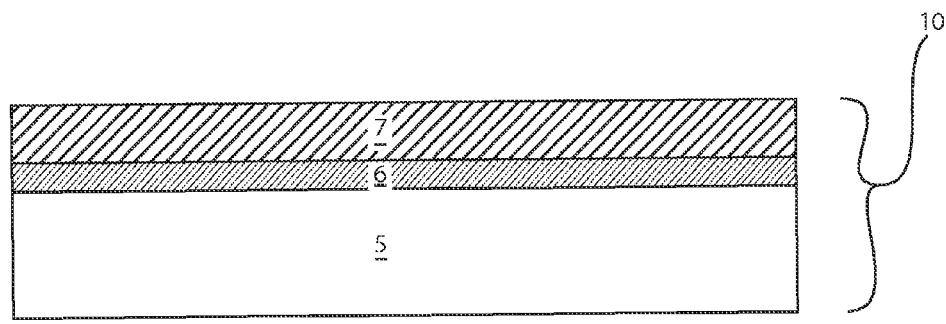
FIG. 1A is a side cross-sectional view depicting one embodiment of a stacked structure of a second semiconductor including layer epitaxially formed on a first semiconductor including layer that is present on a semiconductor base layer, in which the stacked is subsequently processed for forming fin structures, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two side-walls of the fin structure and optionally along the top surface of the fin structure. A Fin Field Effect Transistor (FinFET) is a semiconductor device that positions the channel region of the semiconductor device in a fin structure.

In some embodiments, the methods and structures disclosed herein provide a FinFET semiconductor device with local isolation regions and stressed embedded source and drain regions, wherein the stressed embedded source and drain regions provide for enhancements in device performance. Prior methods for incorporating embedded source and drain regions with a local isolation can create a merge seam or high defect region where the source and drain epitaxial growth planes merge. The methods disclosed herein employ a semiconductor cladding layer that maintains an unbroken non-defect crystal lattice that enables channel strain between the substrate and the fin structure sidewall. By "cladding" it is meant that the semiconductor material is formed on the side-walls, i.e., vertical surfaces, of the etched portions of the fin structures. The semiconductor cladding may also be formed on the horizontal surfaces extending between adjacent fin structures. The methods and structures that are disclosed herein further provide that the channel region of the devices is freely suspended above the substrate so that the gate structure to the semiconductor devices may be formed around an entirety of the channel region. By "suspended" it is meant that the channel region is separated from the underlying semiconductor surface. The methods and structures of the present disclosure are now discussed with more detail referring to FIGS. 1A-11.

FIG. 1A depicts one embodiment of forming a stacked structure 10 of a second semiconductor layer 7, e.g., silicon including layer, that is epitaxially formed on first semiconductor layer 6, e.g., germanium including layer, that is present on a base semiconductor layer 5, e.g., semiconductor substrate, in which the stacked structure 10 is subsequently processed for forming fin structures. In the following description, the second semiconductor layer 7 will be referred to as a silicon including layer 7, and the first semiconductor layer 6 will be referred to as a germanium including layer 6. It is noted that this represents only one embodiment of the types of materials that may provide the second semiconductor layer and the first semiconductor layer, which is not intended to limit the present disclosure, as other compositions have also been contemplated for these material layers. For example, embodiments have been contemplated in which the first semiconductor layer is silicon including layer and the second semiconductor layer is a germanium including layer.

In some embodiments, the base semiconductor layer 5, which may also be referred to as a semiconductor substrate, may be a bulk semiconductor substrate. The bulk semiconductor substrate may have a single crystal, monocrystalline, crystal structure. In some embodiments, the base semiconductor layer 5 is composed of a silicon including material. In some embodiments, the silicon including material that provides the base semiconductor layer 5 may include, but is not limited to silicon, single crystal silicon, multicrystalline silicon, polycrystalline silicon, amorphous silicon, strained silicon, silicon doped with carbon (Si:C), silicon alloys or any combination thereof. In other embodiments, the base semiconductor layer 5 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. It is noted that the above-noted materials that are provided for the base semiconductor layer 5 are provided for illustrative purposes only, and it is not intended that the base semiconductor layer 5 be only limited to the above noted materials. For example, in some embodiments, any material is suitable for the base semiconductor layer 5, so long as the germanium including layer 6 can be removed selectively to the base semiconductor layer 5.

The germanium including layer 6 that is present on the base semiconductor layer 6 may be formed using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. An epitaxial material is a material that has been deposited using an epitaxial deposition process, and therefore has the characteristics of an epitaxially deposited material, such as having the substantially the same crystalline characteristics as the semiconductor material of the deposition surface. In some embodiments, when the chemical reactants are controlled and the system parameters set correctly, the depositing atoms of an epitaxial deposition process arrive at the deposition surface with sufficient energy to move around on the surface and orient themselves to the crystal arrangement of the atoms of the deposition surface. For example, an epitaxial film deposited on a {100} crystal surface will take on a {100} orientation. The epitaxially formed material may be formed on the deposition surface white present within the deposition chamber of a chemical vapor deposition (CVD) chamber, or the deposition chamber of a plasma enhanced chemical vapor deposition (PECVD) chamber.

In one embodiment, the germanium including layer 6 is composed of silicon and germanium, e.g., silicon germanium (SiGe). Other compositions for the germanium including layer 6 can include germanium (Ge) and silicon germanium doped with carbon (SiGe:C). AS noted above, other compositions have been contemplated for the germanium including layer 6 that provides the first semiconductor layer of the stacked structure that is processed to provide the fin structures for the semiconductor devices that are disclosed herein. For example, embodiments have been contemplated, in which the germanium containing layer 6 is replaced with another type IV semiconductor, such as a semiconductor layer that is composed of silicon or silicon doped with carbon. In yet further embodiments, the compositions of the germanium including layer 6 may be replaced with a compound semiconductor, such as a type III-V semiconductor material. The compound semiconductor material may be selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gall nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. Other material compositions may be equally suitable for use with the present disclosure.

A number of different sources may be used for the deposition of the semiconductor material that forms the germanium including layer 6. In some embodiments, in which the semiconductor material that forms the germanium including layer 6 is composed of germanium, the germanium gas source for epitaxial deposition may be selected from the group consisting, of germane (GeH$_4$), digermane (Ge$_2$H$_6$), halogermane, dichlorogermane, trichlorogermane, tetrachlorogermane and combinations thereof. In some embodiments, in which the semiconductor material that forms the germanium including layer 6 is composed of silicon germanium, the silicon sources for epitaxial deposition may be selected from the group consisting of silane, disilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. It is noted that the above examples of source gasses for deposition of epitaxial material are provided for illustrative purposes only, and are not intended to be limitation. Other deposition source gasses may be equally suitable for use with the present disclosure. It is noted that epitaxial deposition is not the only method contemplated for forming the germanium including layer 6. For example, the germanium including layer 6 may be formed using layer transfer and bonding methods.

The thickness of the germanium including layer 6 may range from 25 nm to 500 nm. In another embodiment, the thickness of the germanium including layer 6 may range from 30 nm to 100 nm. In yet another embodiment, the thickness of the germanium including layer 6 may range from 30 nm to 60 nm.

FIG. 1A further depicts a silicon including layer 7 that is epitaxially formed on the germanium including layer 6. The silicon including layer 7 is typically composed of silicon (Si), e.g., substantially 100 wt. % silicon. In other embodiments, the silicon including laver 7 is composed of silicon doped with carbon (Si:C). As noted above, other compositions have been contemplated for the silicon including layer 7 that provides the second semiconductor layer of the stacked structure that is processed to provide the fin structures for the semiconductor devices that are disclosed herein. For example, other compositions of semiconductor material have been contemplated for the silicon including layer 7 so long as the composition selected allows for the germanium including layer 6 to be selectively removed without substantially etching the silicon including layer 7. The silicon including layer 7 may be replaced with another type IV semiconductor, such as a semiconductor layer that is composed of germanium (Ge). In yet further embodiments, the compositions of the silicon including layer 7 may be replaced with a compound semiconductor, such as a type III-V semiconductor material. The above provided list of compound semiconductor compositions that have been provided for the germanium including layer 6 may be suitable for the silicon including layer 7.

In some embodiments, the silicon including layer 7 is formed using an epitaxial deposition process that is similar to the epitaxial deposition process that is described above for forming the germanium including layer 6. The thickness of the silicon including layer 7 may be selected to provide the thickness of the channel region of the semiconductor devices that are formed from the stacked structure 10. For example, the thickness of the silicon including layer 7 may range from 10 nm to 500 nm. In another embodiment, the thickness of the silicon including layer 7 may range from 30 nm to 100 nm. In yet another embodiment, the thickness of the silicon including layer 7 may range from 30 nm to 60 nm.

Figure 1B:
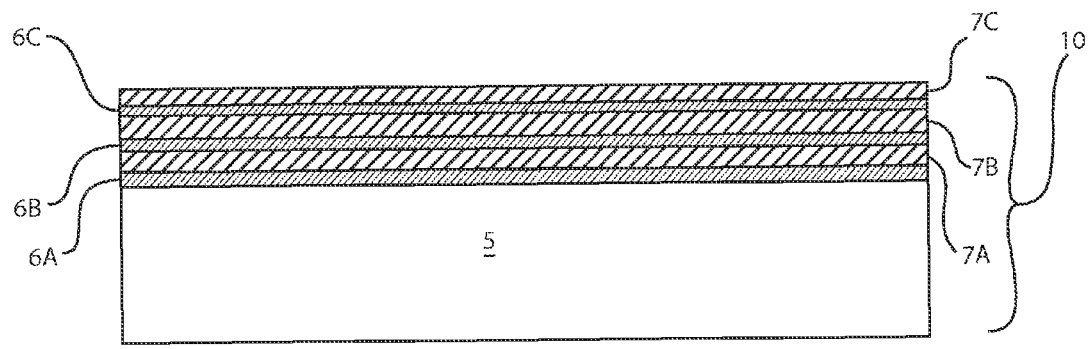
FIG. 1B is a side cross-sectional view depicting another embodiment of a stacked structure of a sequence of multiple semiconductor layers of alternating semiconductor compositions that are present on a semiconductor base layer, in accordance with the present disclosure.

FIG. 1B depicts another embodiment of the present disclosure, in which the stacked structure 10 includes a sequence of multiple silicon including layers 7a, 7b, 7c and multiple germanium including layers 6a, 6b, 6c that are present on a base semiconductor layer 5. The description of the base semiconductor layer 5 that is described above with reference to FIG. 1A is suitable for the description of the base semiconductor layer 5 that is depicted in FIG. 1B. For example, the base semiconductor layer 5 may be composed of a silicon including material, such as silicon. The description of the composition of the silicon including layer 7 that is depicted in FIG. 1A is suitable for the composition of the silicon including layers 7a, 7b, 7c that are depicted in FIG. 1B, and the description of the germanium including layer 6 that is depicted in FIG. 1A is suitable for the composition of the germanium including layers 6a, 6b, 6c that are depicted in FIG. 1B. The sequence of multiple silicon including layers 7a, 7b, 7c and multiple germanium including layers 6a, 6b, 6c that are present on the base semiconductor layer 5 are provided using an epitaxial deposition process, in which the gas precursors are alternated to provide the different layers of different compositions. In one example, the thickness of each layer in the sequence of multiple silicon including layers 7a, 7b, 7c and multiple germanium including layers 6a, 6b, 6c may range from 3 nm to 50 nm. In another example, the thickness of the thickness of each layer in the sequence of multiple silicon including layers 7a, 7b, 7c and multiple germanium including layers 6a, 6b, 6c, may range from 5 nm 20 nm. Although FIG. 11B depicts 6 layers that provide the sequence of multiple silicon including layers 7a, 7b, 7c and multiple germanium including layers 6a, 6b, 6c, the present disclosure is not limited to only this example. Any number of material layers may be included in the sequence of multiple silicon including layers 7a, 7b, 7c and multiple germanium including layers 6a, 6b, 6c.

Figure 1C:
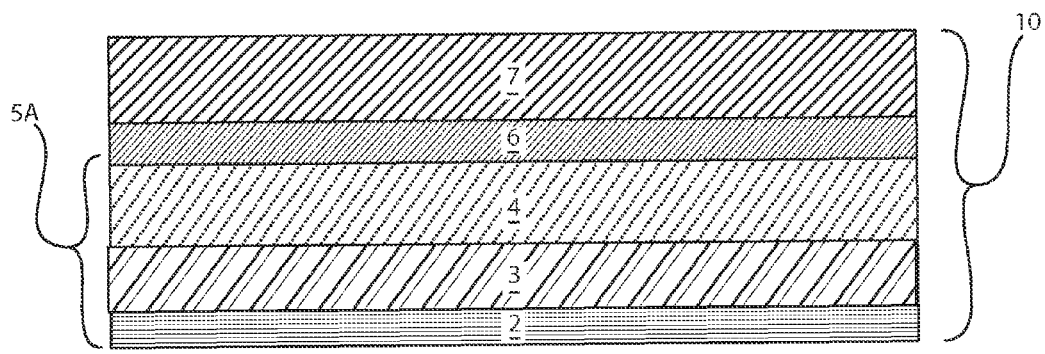
FIG. 1C is aside cross-sectional view depicting one embodiment of a stacked structure of a second semiconductor layer, e.g., including layer, that is epitaxially formed on a first semiconductor layer, e.g., germanium including layer, that is present on the semiconductor on insulator (SOI) layer of a semiconductor on insulator (SOI) substrate, in accordance with the present disclosure.

FIG. 1C depicts one embodiment of a stacked structure 10 of a silicon including layer 7 epitaxially formed on a germanium including layer 6 that is present on the semiconductor on insulator (SOI) layer 4 of a semiconductor on insulator (SOI) substrate 5a. The SOI substrate 5a may include a semiconductor on insulator (SOI) layer 4, a buried dielectric layer 3 and a base semiconductor layer 2. The SOI layer 4 is typically composed of a silicon including material. The buried dielectric layer 3 may be composed of an oxide, such as silicon oxide; a nitride, such as silicon nitride; an oxynitride, such as silicon oxynitride; or a combination thereof. The base semiconductor layer 2 may be similar to the base semiconductor layer 5 that is described above with reference to FIG. 1A. Therefore, the description of the base semiconductor layer 5 that is depicted in FIG. 1A is suitable for the base semiconductor layer 2. The SOI substrate 5A that is depicted in FIG. 1C is suitable for forming finFET structures in combination with memory devices, such as embedded dynamic random access memory (eDRAM) devices, on the same semiconductor substrate.

Figure 2A:
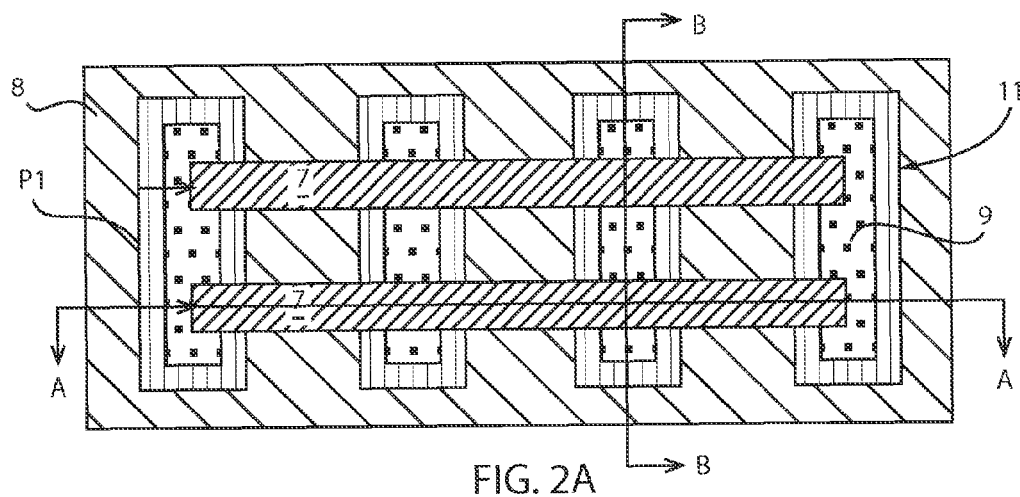
FIG. 2A is a top down view depicting forming fin structures from the layered stack depicted in FIG. 1A and forming at least one sacrificial gate structure on a channel region portion of at least one fin structure, in accordance with one embodiment of the present disclosure.
Figure 2B:
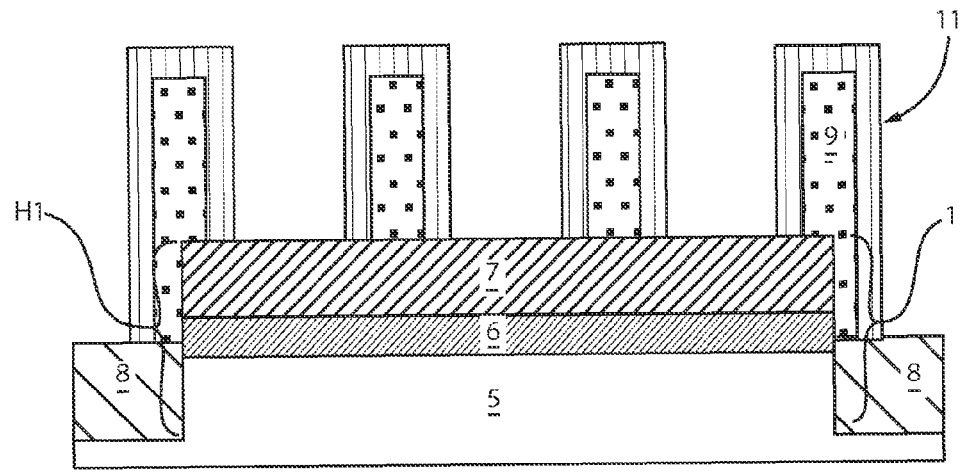
FIG. 2B is a side cross-sectional view along section line A-A in FIG. 2A (which is hereafter referred to as a cross-section of the tin structure that is parallel to a length of the fin structure).
Figure 2C:
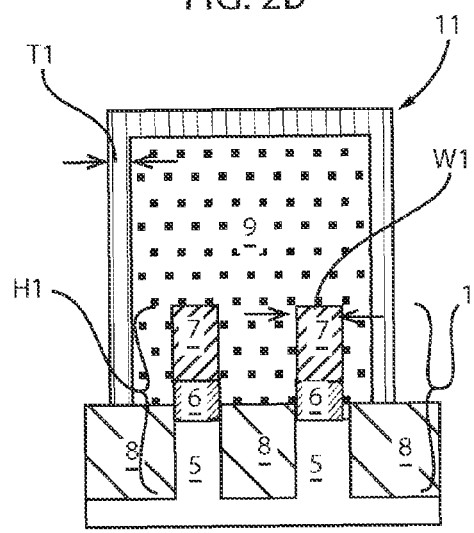
FIG. 2C is a side cross-sectional view along section line B-B in FIG. 2B (which is hereafter referred to as a cross-section of the fin structure that is perpendicular to a length of the fin structure).

FIGS. 2A-2C depicts one embodiment of forming fin structures 1 from the layered stack that is depicted in FIG. 1A. Although FIGS. 2A-2C specifically depict forming the fin structures 1 from the layered stack depicted in FIG. 1A, the following description for forming the fin structures depicted in FIGS. 2A-C is equally applicable to forming fin structures from the layered stack that is depicted in FIGS. 1B and 1C. The fin structures 1 may be formed using etch processing. For example, the fin structures 1 may be formed using sidewall image transfer (SIT) methods. For example, the at least one fin structure 1 may be formed using sidewall image transfer (SIT) methods. More specifically, in one example of a SIT method, a sacrificial mandrel is first formed on a surface of the material layer for forming the at least one fin structure 1. The sacrificial mandrel may be formed using deposition, patterning and development processes. Thereafter, a deposition such as chemical vapor deposition provides a dielectric profile on the sidewalls of the sacrificial mandrel. The sacrificial mandrel may then be removed. For example, sacrificial mandrel can be removed using a chemical strip or selective etching. In some examples, the sacrificial mandrel is amorphous carbon. In some examples, the sacrificial is amorphous silicon. Following removal of the sacrificial mandrel, the dielectric profile remains to provide an etch mask. The material layer provided by the silicon including layer 7, the germanium including layer 6 and the base semiconductor layer 5 for the at least one fin structure 1 is then etched using the dielectric profile as an etch mask to define the geometry and dimensions of the least one fin structure 1. The etch process for forming the at least one fin structure 1 may be an anisotropic etch, such as reactive on etching (RIE).

Following the formation of the fin structures 1, an isolation region 8 may be formed between the adjacent fin structures 1. The isolation region 8 may be composed of a dielectric material, such as an oxide, nitride, or oxynitride material. For example, when the dielectric material of the isolation region 8 is an oxide, the isolation region 8 may be composed of silicon oxide ($SiO_2$). The isolation regions 8 may be formed by depositing the dielectric material in the trenches that are formed by etching the base semiconductor layer 5 to form the fin structures 1. In some embodiments, the dielectric material for the isolation regions 8 is deposited using chemical vapor deposition, and then etched back to recess the isolation regions 8 in order to adjust the height for the fin structures 1. In some embodiments, the etch process for recessing the isolation regions 8 may also remove the dielectric mask that results from the sidewall image transfer (SIT) process that is used to form the fin structures 1.

Referring to FIGS. 2B and 2C, each of the fin structures 1 may have a height $H_1$ ranging from 25 nm to 500 nm. In another embodiment, each of the plurality of fin structures 1 has a height $H_1$ ranging from 30 nm to 100 nm. In one example, each of the plurality of fin structures 1 has a height $H_1$ ranging from 30 nm to 60 nm. Each of the plurality of fin structures 1 may have a width $W_1$ of less than 20 nm. In another embodiment, each of the plurality of fin structures 1 has a width $W_1$ ranging from 3 nm to 8 nm. Although two fin structures 1 are depicted in FIG. 2, the present disclosure is not limited to only this example. It is noted that any number of fin structures 1 may be present in the plurality of fin structures 10'. Referring to FIG. 2A, the pitch P1 separating adjacent fin structures 1 may range from 10 nm to 500 nm. In another example, the pitch P1 separating adjacent fin structures 1 may range from 20 nm to 50 nm.

FIGS. 2A, 2B and 2C also depict forming a sacrificial gate structure 9 on a channel portion of the fin structures 1. By "sacrificial" it is meant that the structure is present during processing of the semiconductor device, but is removed from the semiconductor device prior to the device being completed. In the present process flow, a sacrificial gate structure 9 is employed as part of a replacement gate process. As used herein, the term "sacrificial gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the sacrificial gate structure 9 may be composed of any material that can be etched selectively to the fin structures 1. In one embodiment, the sacrificial gate structure 9 may be composed of a silicon-including material, such as polysilicon. In another embodiment, the sacrificial gate structure 9 may be composed of a dielectric material, such as an oxide, nitride or oxynitride material, or amorphous carbon. The sacrificial gate structure 9 may be formed using deposition (e.g., chemical vapor deposition) photolithography and etch processes (e.g., reactive ion etching) to provide the sacrificial gate structure 9.

FIGS. 2A-2C also depicts forming a dielectric spacer 11 on the sidewall of the sacrificial gate structure 9. The dielectric spacer 11 is typically composed of a dielectric material, such as an oxide, nitride, or oxynitride material. In one example, when the dielectric spacer 11 is composed of a nitride, the dielectric spacer 11 may be composed of silicon nitride, and when the dielectric spacer 11 is composed of oxide, the dielectric spacer 11 may be composed of silicon oxide. In another example, the dielectric spacer 11 may be composed of a low-k dielectric. In some examples, the low-k dielectric of the gate sidewall spacer may have a dielectric constant of 4.0 or less (measured at room temperature, e.g., 25° C., and 1 atm). For example, a low-k dielectric material suitable for the dielectric spacer 11 may have a dielectric constant ranging from about 1.0 to about 3.0. Examples of low-k materials suitable for the dielectric spacer 11 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The dielectric spacer 11 may be formed using a deposition process, such as chemical vapor deposition (CVD), and an anisotropic etchback method. The dielectric spacer 11 may be present on the sidewalk and upper surface of the sacrificial gate structure 9, and may have a thickness T1 ranging from 1 nm to 15 nm.

Figure 3A:
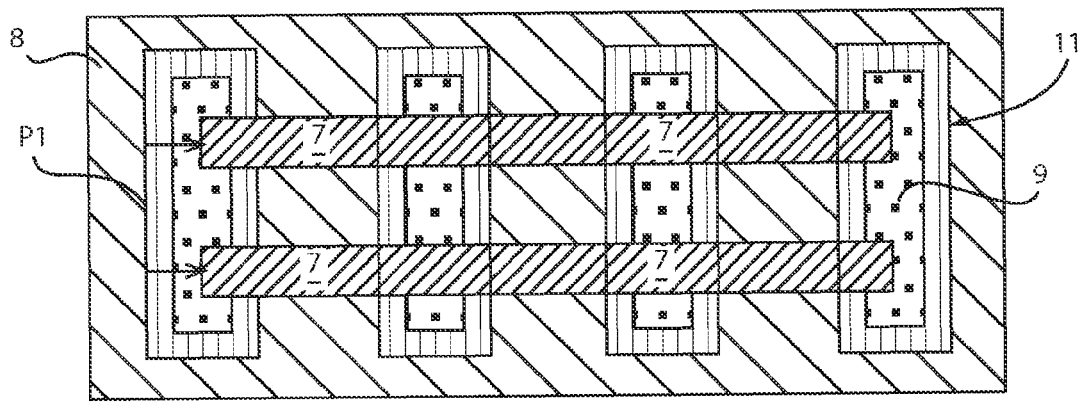
FIG. 3A is a top down view depicting etching exposed portions of the at least one fin structure, in accordance with one embodiment of the present disclosure.
Figure 3B:
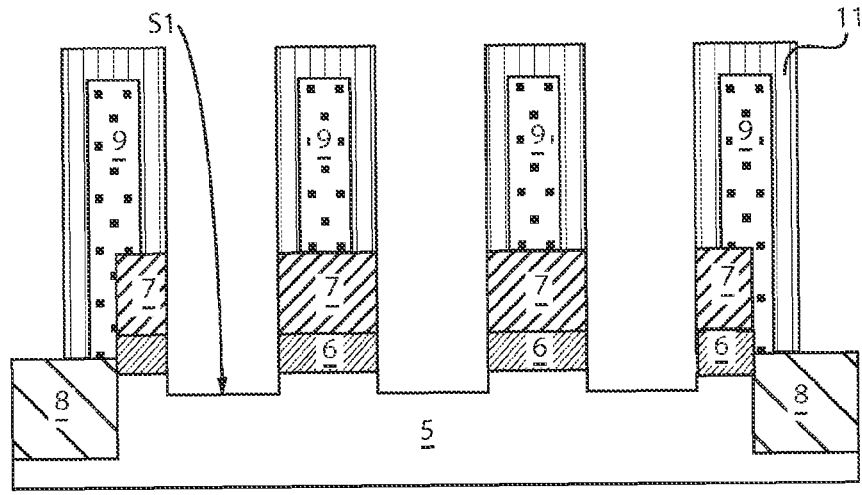
FIG. 3B is a side cross-sectional view of the fin structure that is depicted in FIG. 3A, wherein the cross-section is parallel to the length of the fin structure.
Figure 3C:
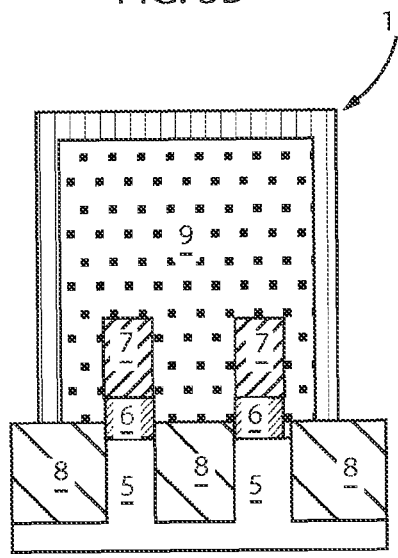
FIG. 3C is a side cross-sectional view of the fin structure that is depicted in FIG. 3A, wherein the cross-section is perpendicular to the length of the fin structure.

FIGS. 3A-3C depict etching exposed portions of the at least one fin structure 1 that is depicted in FIGS. 2A-2C. Although FIGS. 3A-3C specifically depict etching the fin structures that were formed from the layered stack depicted in FIG. 1A, the following description for aching the exposed portions of the fin structures depicted in FIGS. 3A-3C is equally applicable to the fin structures that have been from the layered stack that is depicted in FIGS. 1B and 1C.

FIGS. 3A-3C depict one embodiment of etching the source and drain region portions of the fin structures 1 to provide a recessed surface S1 of the base semiconductor layer 5. The source and drain region portions of the fin structure 1 may be etched using an etch process that is selective to the dielectric spacer 11 that is present on the sacrificial gate structure 9. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:11 or greater, e.g., 1000:1. For example, the etch process may remove the exposed silicon material of the silicon including layer 7 and the exposed silicon germanium material of the germanium containing layer 6 selectively to the silicon nitride material of the dielectric spacer 11.

In some embodiments, the etch process for etching the source and drain region portions of the fin structure 1 is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RE). Other examples of anisotropic etching that can be used at this point of the present disclosure include ion beam etching, plasma etching or laser ablation. In some embodiments, the etch process for etching the source and drain region portions of the fin structure 1 is a timed etch. Typically, the etch process may continue until a depth of the fin structure 1 is reached that extends through both the silicon including layer 7 and the germanium including layer 6 into the base semiconductor layer 5.

Figure 3D:
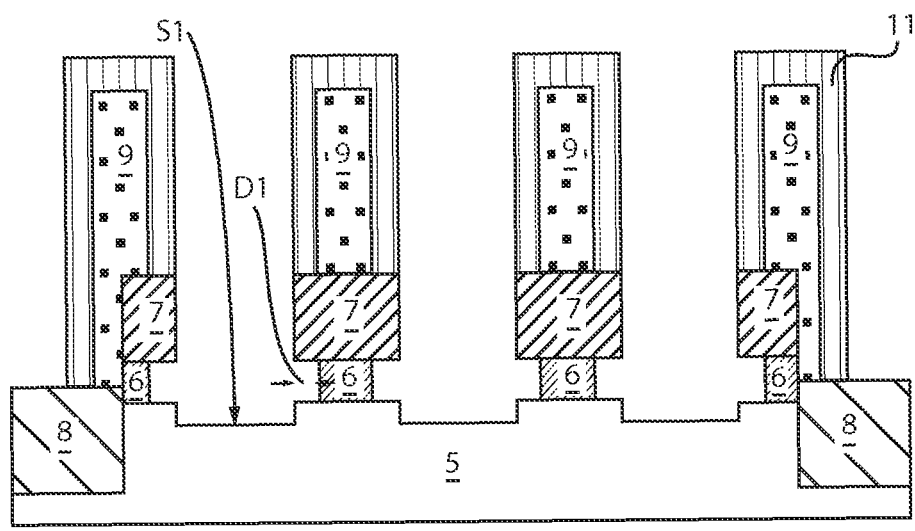
FIG. 3D is a side cross-sectional view of the fin structure that is depicted in FIG. 3A, after a further step of laterally etching the first semiconductor layer, e.g., germanium including layer, of the fin structures, wherein the cross-section is parallel to the length of the fin structure, in accordance with one embodiment of the present disclosure.

FIG. 3D depicts one embodiment of an optional laterally etching step for removing an exposed sidewall portion of the germanium including layer 6. In this embodiment, an isotropic etch, such as a plasma etch or wet chemical etch may remove a portion of the germanium including layer 6 selectively to the base semiconductor layer 5, the silicon including layer 6 and the dielectric spacer 11 that is present on the sacrificial gate structure 9. Contrary to an anisotropic etch, an isotropic etch is not directional. The lateral etch step may be continued until a notch is formed undercutting the overlying portion of the silicon including layer 7 that has a dimension D1 ranging from 1 nm 20 nm. In another embodiment, the lateral etch step may be continued until a notch is formed undercutting the overlying portion of the silicon including layer 7 that has a dimension D1 ranging from 1 nm to 5 nm. It is noted that the laterally etching step is optional, and may be omitted.

Figure 4A:
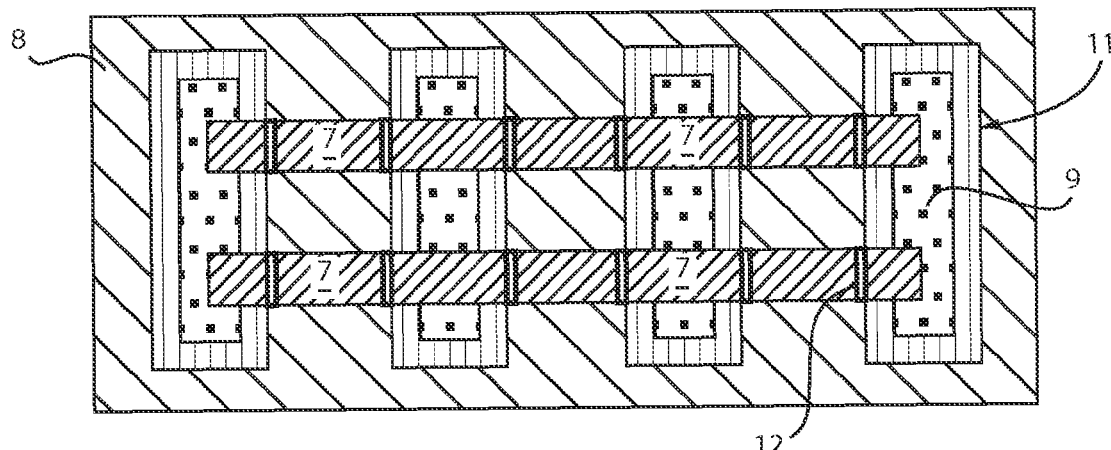
FIG. 4A is a top down view depicting forming a semiconductor cladding layer on sidewalk of a remaining portion of the at least one fin structure that is depicted in FIG. 3A.
Figure 4B:
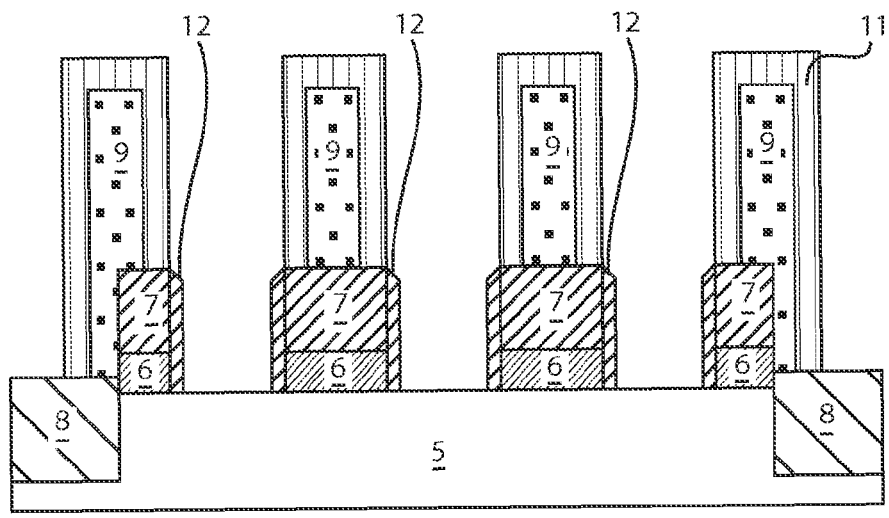
FIG. 4B is a side cross-sectional view of the fin structure that is depicted in FIG. 4A, wherein the cross-section is parallel to the length of the fin structure.
Figure 4C:
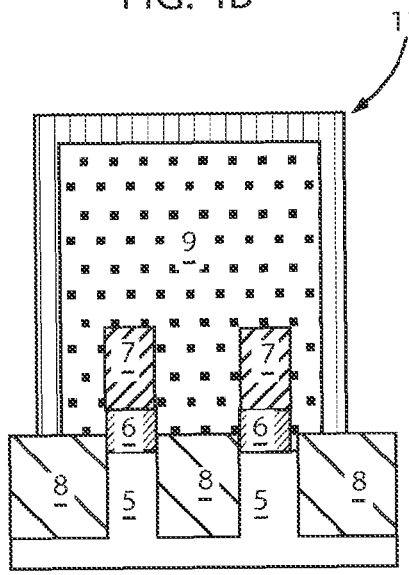
FIG. 4C is a side cross-sectional view of the fin structure that is depicted in FIG. 4A, wherein the cross-section is perpendicular to the length of the fin structure.

FIGS. 4A-4C depict one embodiment of forming a semiconductor cladding layer 12 on sidewalls of a remaining portion of the at least one fin structure that is depicted in FIGS. 3A-3C. In one embodiment, the semiconductor cladding layer 12 is composed of 100 wt. % silicon (Si). In another embodiment, the semiconductor cladding layer 12 may be an alloy of silicon and another element, e.g., germanium (Ge). The semiconductor cladding layer 12 may also be composed of n-type or p-type doped silicon. Although the semiconductor cladding layer 12 is hereafter described as a silicon cladding layer when the first semiconductor layer is a germanium including layer 6, and the second semiconductor layer is a silicon including layer 7, other material compositions have been contemplated for the semiconductor cladding layer 12. The semiconductor cladding layer 12 may be composed of any semiconductor material that is not substantially etched by the etch chemistry that is used to remove the first semiconductor, e.g., germanium including layer 6, during following steps of the disclosed method. For example, in addition to silicon including materials, such as silicon (Si), embodiments have been contemplated in which the semiconductor cladding layer 12 includes germanium, such as germanium (Ge) or silicon germanium (SiGe), and embodiments have been contemplated in which the semiconductor cladding layer 12 is composed of a compound semiconductor material, such as a type semiconductor. The above description of compound semiconductor materials that are suitable for the first and second semiconductor layers is suitable for a description of some examples of possible compound semiconductor material compositions that are suitable for the semiconductor cladding layer 12. For the purposes of simplicity, the semiconductor cladding layer 12 is hereafter referred to as a silicon cladding layer 12.

The silicon cladding layer 12 may be a conformally deposited layer that is present on at least the exposed sidewalk of the germanium containing layer 7. The term "conformal" denotes a layer having a thickness that does not deviate from greater than or less than 30% of an average value for the thickness of the layer. In some embodiments, the silicon cladding layer 16 is also formed on the exposed sidewalk of the silicon including layer 7, the exposed sidewalk of the etched portion of the base semiconductor layer 5 and the exposed upper surface of the base semiconductor layer 5 that is extending between adjacent fin structures 1.

In some embodiments, the silicon cladding layer 12 may be formed using an epitaxial deposition process. The epitaxial deposition process for forming the silicon cladding layer 12 may be a selective deposition process. For example, although the epitaxially deposited material orientates to the crystal arrangement of a semiconductor material and is deposited thereon, the epitaxial semiconductor material may not be deposited on a dielectric material, such as the dielectric spacer 11 that is present on the sacrificial gate structure 9. In other embodiments, semiconductor material for the silicon cladding layer 12 that is deposited on dielectric surfaces during the epitaxial deposition process has an amorphous crystal structure, wherein the epitaxially deposited material that is deposited on semiconductor surfaces, such as the germanium including layer 6, have a crystalline crystal structure. In this example, the amorphous material that is formed on the dielectric surfaces may be removed selective, e.g., by selective etching, without removing the crystalline epitaxial material that is formed on the semiconductor containing surfaces, such as the germanium including layer 6. In some embodiments, the silicon cladding layer 12 has a thickness ranging from 0.5 nm to 20 nm. In another embodiment, the silicon cladding layer 12 has a thickness ranging from 1 nm to 5 nm.

Figure 5A:
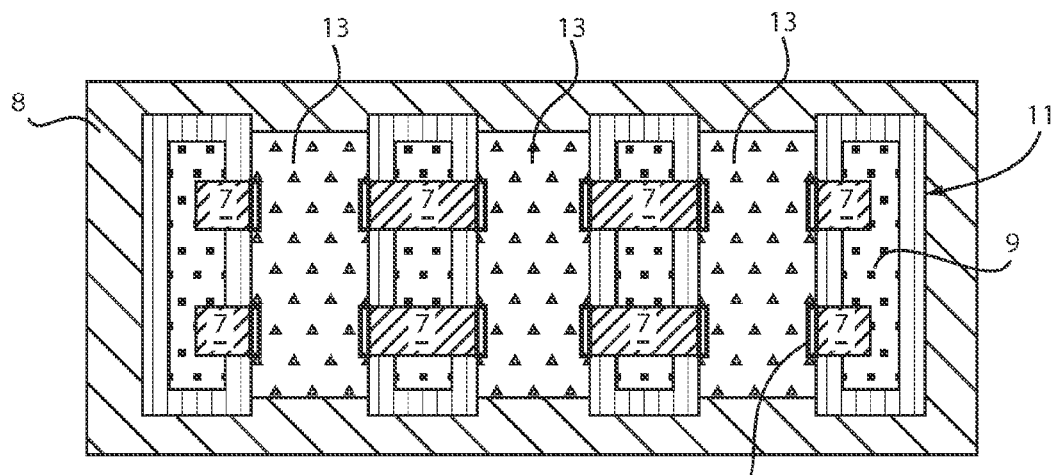
FIG. 5A is a top down view depicting forming source and drain merge structures in contact with the remaining portion of the at least one fin structure through the silicon cladding layer that is depicted in FIG. 4A, in accordance with one embodiment of the present disclosure.
Figure 5B:
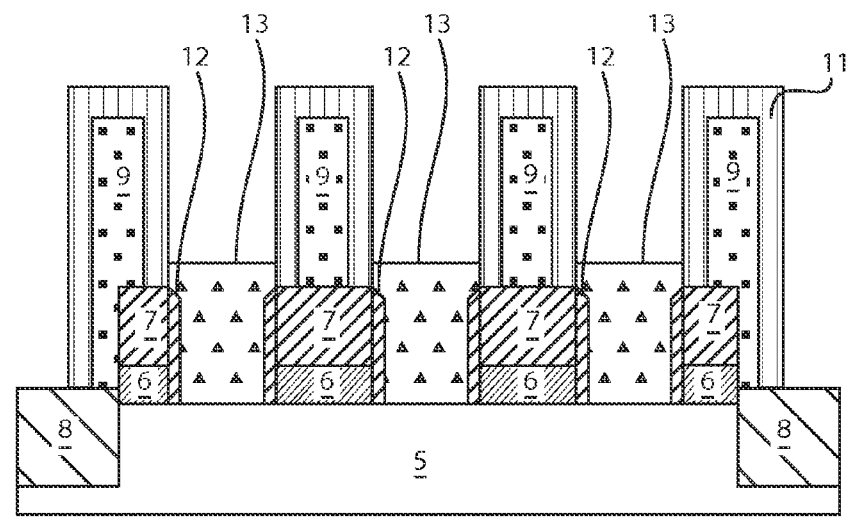
FIG. 5B is a side cross-sectional view of the fin structure that is depicted in FIG. 5A, wherein the cross-section is parallel to the length of the fin structure.
Figure 5C:
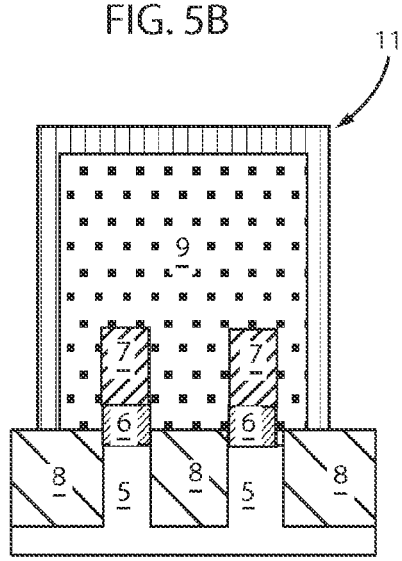
FIG. 5C is a side cross-sectional view of the fin structure that is depicted in FIG. 5A, wherein the cross-section is perpendicular to the length of the fin structure.

FIGS. 5A-5C depict one embodiment of forming source and drain merge structures 13 (hereafter referred to as being epitaxial merge structures) extending between the adjacent fin structures 1 that are depicted in FIGS. 5A-5C, in which the epitaxial merge structures 13 are formed in direct contact with the silicon cladding layer 12. The epitaxial merge structures 13 may provide the source and drain region portions of the semiconductor device. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on.

The epitaxial merge structures 13 may be a type IV semiconductor material, such as a silicon including material, or may be a compound semiconductor, such as a type III-V semiconductor material. For example, when the epitaxial merge structures 13 is a type IV semiconductor material, the epitaxial merge structures 13 may be composed of silicon, single crystal silicon, multicrystalline silicon, polycrystalline silicon, silicon doped with carbon (Si:C), germanium (Ge), silicon germanium (SiGe), silicon germanium doped with carbon (SiGe:C) and combinations thereof. When the epitaxial merge structures 13 are composed of a compound semiconductor, such as a type III-V semiconductor material, the epitaxial merge structures 13 may be composed of a semiconductor material that is selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), indium arsenide antimonide phosphide (GaInAsSbP) and combinations thereof.

It is noted that the above examples of compositions for the epitaxial material that provides the epitaxial merge structures 13 are provided for illustrative purposes only, and are not intended to be a limitation. Other material compositions may be equally suitable for use with the present disclosure.

In some embodiments, the material of the epitaxial merge structures 13 is selected to provide strain inducing structures, and may be referred to as a strain inducing material. More specifically, in some embodiments, the material of the epitaxial merge structures 13 is selected to have a different lattice dimension than the lattice dimension of the deposition surfaces, e.g., the silicon cladding layer 12. For example, when the silicon cladding layer 12 is composed of silicon (Si), and the semiconductor device is an n-type conductivity FinFET, the epitaxial merge structures 13 may be composed of silicon doped with carbon (Si:C). The smaller lattice dimension of the silicon doped with carbon (Si:C) relative to the silicon cladding layer 12 induces a tensile strain on the channel region portion of the devices that increases the speed of electron charge carriers, which increases the switching speed of the n-type conductivity FinFET. In another example, when the silicon cladding layer 12 is composed of silicon (Si), and the semiconductor device is a p-type conductivity FinFET, the epitaxial merge structures 13 may be composed of silicon germanium (SiGe). The larger lattice dimension of the silicon germanium (SiGe) relative to the silicon cladding layer 12 induces a compressive strain on the channel region portion of the devices that increases the speed of hole charge carriers, which increases the switching speed of the p-type conductivity FinFET.

The epitaxial merge structures 13 may be doped with n-type or p-type dopants. The epitaxial merge structures 13 may be formed using epitaxial deposition and in situ doping method. In some embodiments, the dopant that dictates the conductivity type, i.e., p-type or n-type dopant, for the epitaxial merge structures 13 is introduced to the epitaxially deposited material as it is being formed, which is referred to as being in situ doped. In situ doped epitaxial merge structures 13 having a p-type conductivity may be produced in a type IV semiconductor, such as a silicon including semiconductor or a germanium including semiconductor, by doping the type IV semiconductor material with group III-A elements of the periodic table of elements, such as boron (B). In situ doped epitaxial merge structures 13 having an n-type conductivity may be produced in a type IV semiconductor, such as a silicon including semiconductor or a germanium including semiconductor, by doping the type IV semiconductor material with group V elements of the periodic table of elements, such as phosphorus (P) or arsenic (As). In some embodiments involving type IV semiconductor materials, the uniform concentration of n-type or p-type dopant that is present in the epitaxial merge structures 13 may range from $1 \times 10^{14}$ atoms/cm$^3$ to $2 \times 10^{21}$ atoms/cm$^3$. In another embodiment, the concentration of n-type p-type dopant that is present in the in situ doped epitaxial merge structures 13 may range from $1 \times 10^{19}$ atoms/cm$^3$ to $2 \times 10^{21}$ atoms/cm$^3$. In yet another embodiment, the concentration of n-type or p-type dopant that is present in the in situ doped epitaxial merge structures 13 may range from $1 \times 10^{20}$ atom/cm$^3$ to $1 \times 10^{21}$ atoms/cm$^3$. In one embodiment, the n-type gas dopant source may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines suitable for use with the present disclosure include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source may include diborane (B$_2$H$_6$).

Figure 5D:
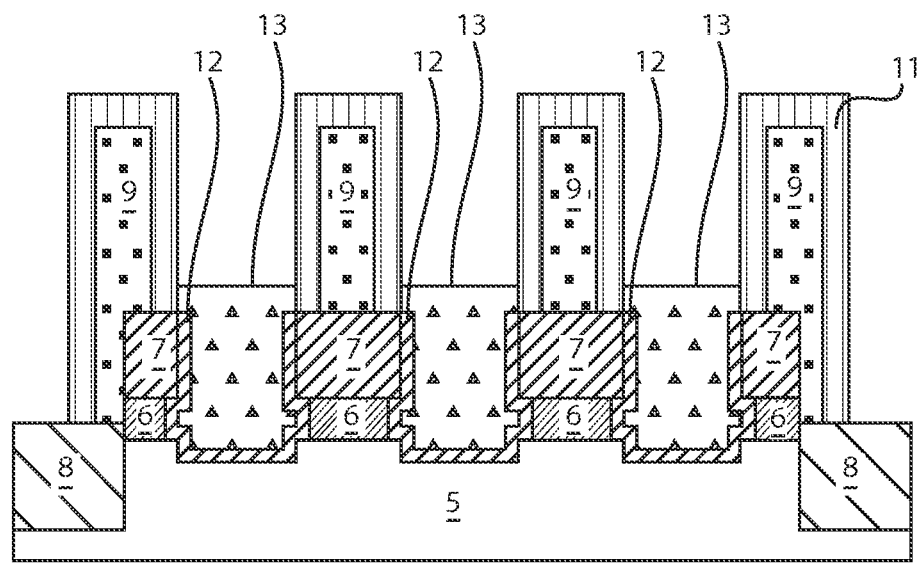
FIG. 5D is a side cross-sectional view of a fin structure of forming a semiconductor cladding layer and a source and drain merge structure on a first semiconductor layer, e.g., germanium including layer, that has been laterally etched as depicted in FIG. 3D, wherein the cross-section is parallel to the length of the fin structure.

FIG. 5D depicts one embodiment of forming the silicon cladding layer 12 and a portion of the epitaxial merge structures 13 in the notch formed by laterally etching the germanium including layer 6 as described above with reference to FIG. 3D. As described above, the silicon cladding layer 12 is deposited using a conformal deposition process, and therefore can be formed on the sidewalk of the laterally etched notch portion of the germanium including layer 7. The epitaxial merge structures 13 may be epitaxially formed on the silicon cladding layer 12 filling the notch. When the epitaxial merge structures 13 are composed of strain inducing material, forming the epitaxial merge structures 13 within the notch region brings the strain inducing material in closer proximity to the channel region of the device, which increases the strain that is induced in the channel region of the device.

Although the supplied figures depict the source and drain region structures of the device including epitaxial merge structures 13, the methods and structures described herein do not require that the epitaxial portions of the source and drain regions be merge structures, as the epitaxial material that provides the source and drain regions to the fin structures may be immerged. Further, the in situ doping for the epitaxial material that provides the source and drain region portions of the device may be a box profile or the epitaxial material may have a graded profile.

In some embodiments, the epitaxial merge structures 13, or immerged epitaxial material that is in contact with the source and drain region portions of the fin structure, are covered by a barrier nitride structure (not shown), such as silicon nitride, or by a encapsulating oxide (not shown), such as silicon oxide. In some embodiments, the barrier nitride structure or encapsulating oxide protects the epitaxial material, such as the epitaxial merge structure, during the following described processes for removing the sacrificial gate structure 9.

Figure 6A:
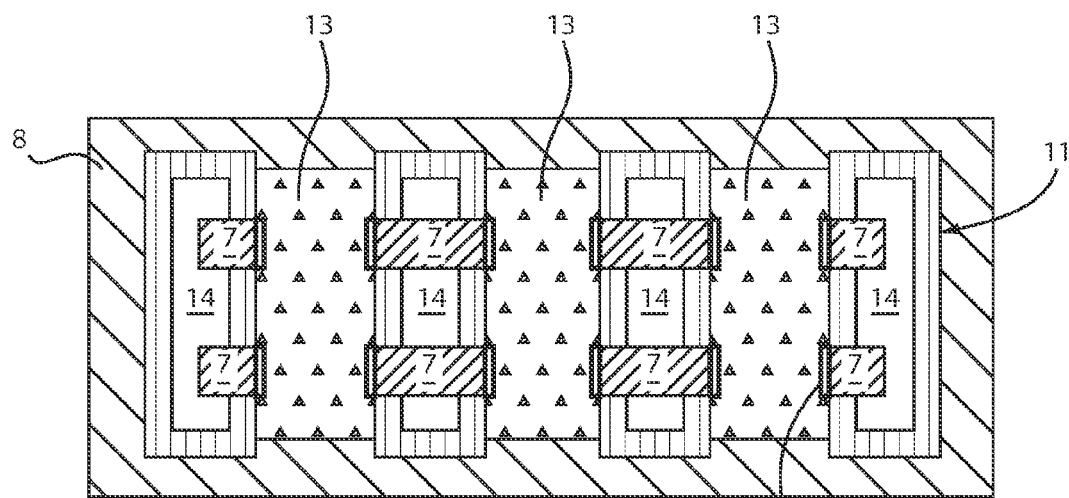
FIG. 6A is a top down view depicting removing the sacrificial gate structure that is depicted in FIG. 5A, in accordance with one embodiment of the present disclosure.
Figure 6B:
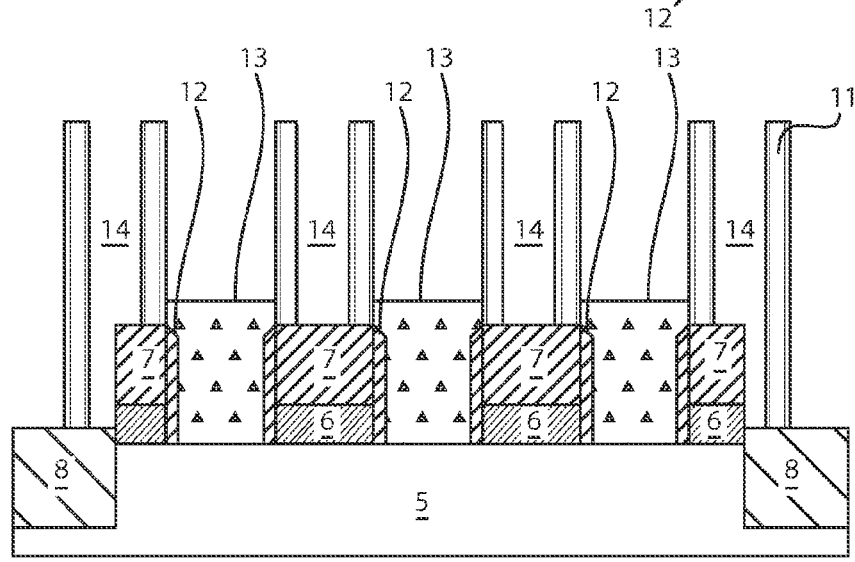
FIG. 6B is a side cross-sectional view of the fin structure that is depicted in FIG. 6A, wherein the cross-section is parallel to the length of the fin structure.
Figure 6C:
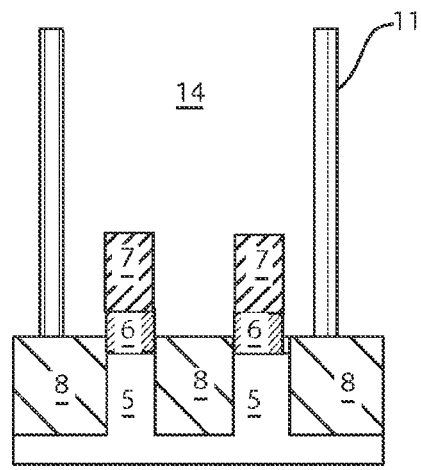
FIG. 6C is a side cross-sectional view of the fin structure that is depicted in FIG. 6A, wherein the cross-section is perpendicular to the length of the fin structure.

FIGS. 6A-6C depict one embodiment of removing the sacrificial gate structure 9 that is present on the channel portion of the fin structures 1. In some embodiments, removing the sacrificial gate structure 9 may begin with removing the portion of the dielectric spacer 11 that is present on the upper surface of the sacrificial gate structure 9. Removing the upper portion of the dielectric spacer 11 may include a planarization process, such as chemical mechanical planarization (CMP), or may include an etch process, such as dry reactive ion etch (RE) or wet etch chemistry. The portions of the dielectric spacer 11 that are present on the sidewalk of the sacrificial gate structure 9 remain after removing the upper portion of the dielectric layer 11 to expose the upper surface of the sacrificial gate structure 9. Removing the sacrificial gate structure 9 exposes the channel portion of the fin structures 1. In some embodiments, removing the sacrificial gate structure 9 exposes at least a portion of the silicon including layer 7 and the germanium including layer 6. In some embodiments, the sacrificial gate structure 9 may be removed by a selective etch process. The sacrificial gate structure 9 may be removed using a wet Or dry etch process. In one embodiment, the sacrificial gate structure 9 is removed by reactive ion etch (RIE). In one example, the etch process for removing the sacrificial gate structure 9 can include an etch chemistry for removing the sacrificial gate structure 9 that is selective to the silicon including layer 7 and the germanium including layer 6.

Figure 7A:
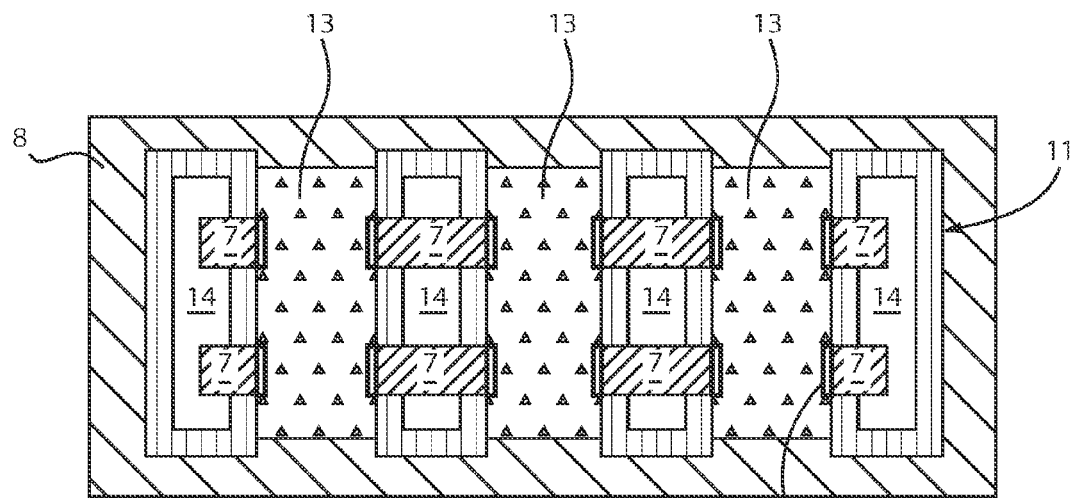
FIG. 7A is a top down view depicting removing the at least one first semiconductor layer, e.g., germanium including layer, of the fin structure depicted in FIG. 6A, in accordance with one embodiment of the present disclosure.
Figure 7B:
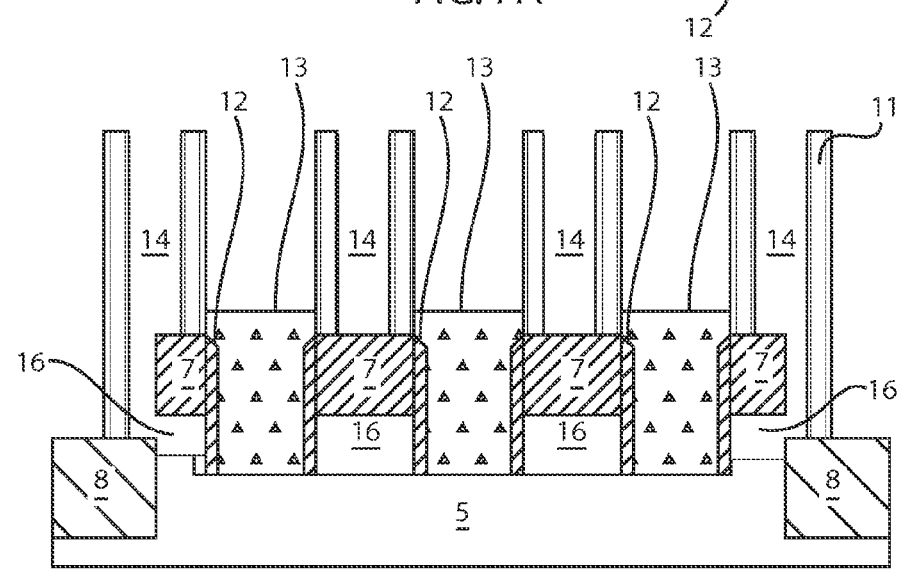
FIG. 7B is a side cross-sectional view of the fin structure that is depicted in FIG. 7A, wherein the cross-section is parallel to the length of the fin structure.
Figure 7C:
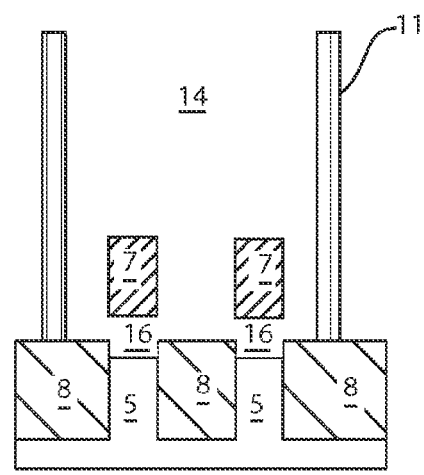
FIG. 7C is a side cross-sectional view of the fin structure that is depicted in FIG. 7A, wherein the cross-section is perpendicular to the length of the fin structure, in accordance with one embodiment of the present disclosure.

FIGS. 7A-7C depicting removing the at least one germanium including layer 6 of the fin structure 1 depicted in FIGS. 6A-6C to provide a void 16 that is underlying the at least one silicon including layer 7. The germanium including layer 6 may be removed by an etch process that is selective to the silicon including layer 7, the dielectric spacer 11 and the epitaxial merge structures 13. Typically, the etch process for removing the silicon including layer 7 is an isotropic etch process. Contrary to anisotropic etching, isotropic etching is substantially non-directional. The germanium including layer 6 of the fin structure 1 may be removed using a wet or dry etch process. For example, in one embodiment, in which the dielectric spacer 11 is composed of silicon nitride (e.g., Si$_3$N$_4$), the silicon including layer 7 is composed of silicon (Si), the epitaxial merge structures 13 are composed of silicon germanium (SiGe), and the germanium containing layer 6 is composed of silicon germanium (SiGe), the germanium containing, layer 6 may be removed by an etch chemistry including hydrochloric acid (HCl). In another embodiment, the etch process for removing the germanium containing layer 6 may include a mixture of ammonium hydroxide and hydrogen peroxide and deionized water (also referred to as SC1). A typical concentration ratio for the mix is 1:1:5 NH$_4$OH:H$_2$O$_2$:H$_2$O. The etch chemistry may operate in a temperature ranging from 50° C. to 70° C. It is noted that the above etch chemistries are provided for illustrative purposes only, and are not intended to limit the present disclosure. Other etch chemistries are suitable for removing the germanium including layer 6, so long as the etch chemistry does not substantially etch the silicon including layer 7 that provides the channel region of the device.

FIG. 7C depicts one embodiment of the silicon including layer 7 being suspended following removal of the germanium including layer 6. The suspended portion of the silicon including layer 7 provides the channel portion of the subsequently formed device. In some embodiments, by suspending the silicon including layer 7, the methods and structures that are disclosed herein allow for the functional gate structure of the device to formed around the entirety of the channel region, as opposed to be formed on only the upper surface of the channel region.

Figure 7D:
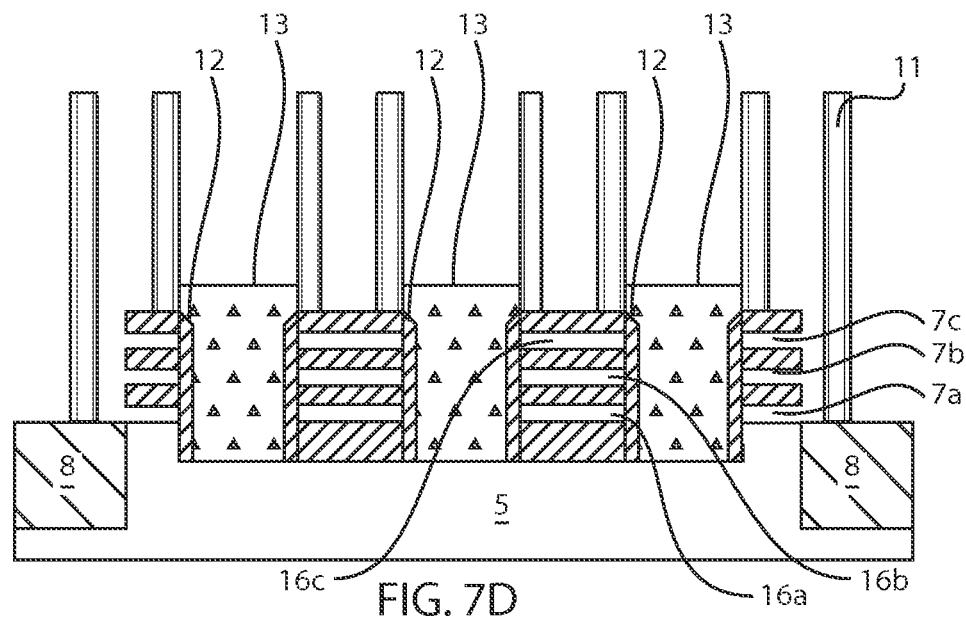
FIG. 7D is a side cross-sectional view of the removing the first semiconductor layer, e.g., germanium including layer, from a fin structure including a sequence of multiple first and second semiconductor layers, e.g., silicon including layers and germanium including layers, formed from the substrate depicted in FIG. 1B, wherein the cross-section is parallel to the length of the fin structure.
Figure 7E:
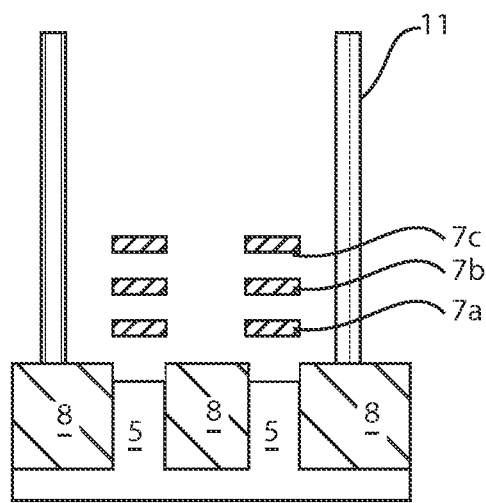
FIG. 7E is a side cross-sectional view of the fin structure that is depicted in FIG. 7E, wherein the cross-section is perpendicular to the length of the fin structure, in accordance with one embodiment of the present disclosure.

FIGS. 7D and 7E depict one embodiment of removing the germanium including layers 6 from a fin structure 1 including a sequence of multiple silicon including layers 7 and multiple germanium including layers 6 formed from the stacked structure 10 that is depicted in FIG. 1B.

Figure 8A:
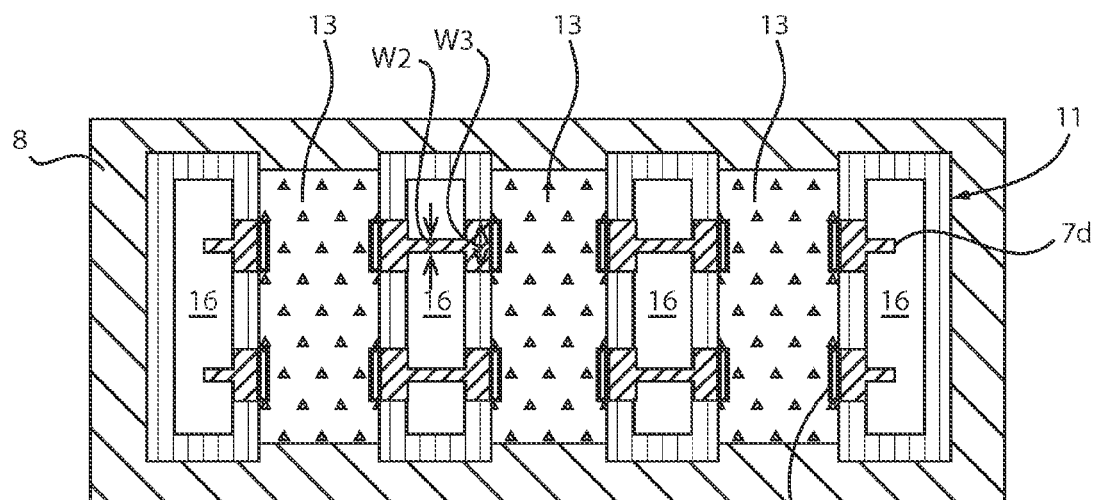
FIG. 8A is a top down view of forming a nanowire from the remaining portion of the second semiconductor layer, e.g., silicon including layer, that is depicted in FIG. 7A, in accordance with one embodiment of the present disclosure.
Figure 8B:
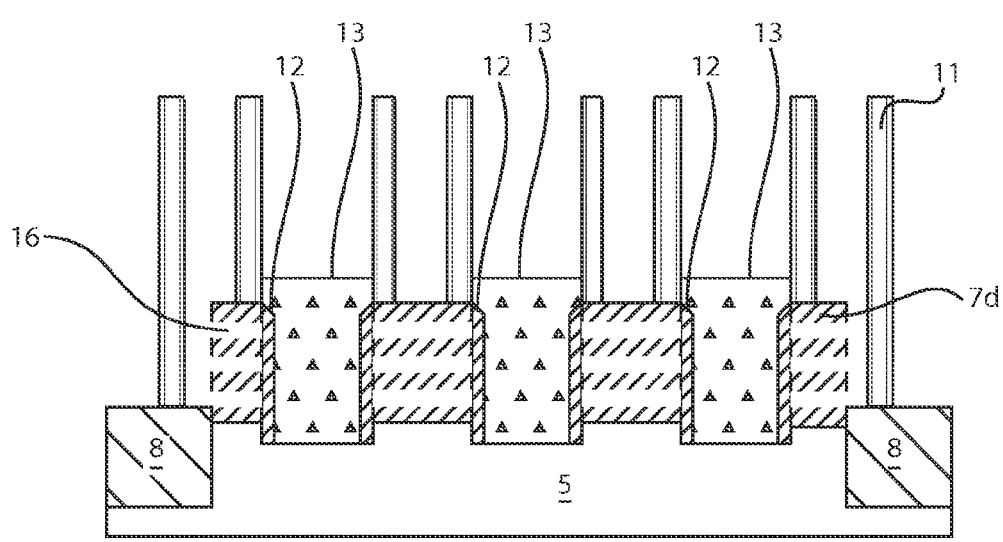
FIG. 8B is a side cross-sectional view of the fin structure that is depicted in FIG. 8A, wherein the cross-section is parallel to the length of the fin structure.
Figure 8C:
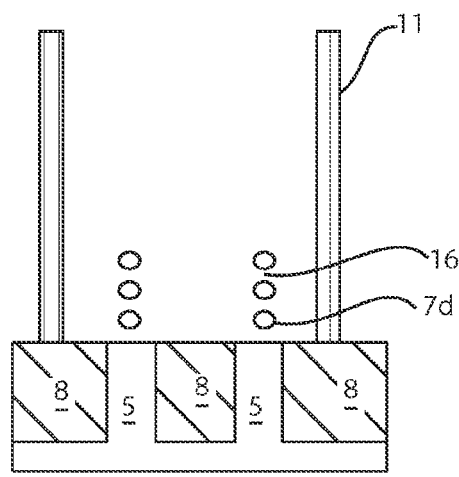
FIG. 8C is a side cross-sectional view of the fin structure that is depicted in FIG. 8A, wherein the cross-section is perpendicular to the length of the fin structure.

FIGS. 8A-8C depict one embodiment of forming nanowires 7d from the remaining portion of the silicon including layer that is depicted in FIGS. 7D and 7E. As used herein, the term "nanowire" describes a structure having a cross-section with a perimeter defined by a curvature, wherein a diameter of the cross-section is less than 1 micron. In some examples, the cross-section of the nanowire may have a diameter ranging from 1 nm to 40 nm. The multi-sided cross section, e.g., square or rectangular cross section, of the remaining portion of the silicon including layer may be smoothed to form an elliptical shaped or cylindrical shaped nanowire 7d, e.g., nanowire 7d having a circular geometry cross-section or oblong geometry cross-section (as depicted in FIG. 8C) using a hydrogen anneal. The portions of the silicon including layer 7d that are underlying the dielectric spacer 11 are protected from being smoothed by the hydrogen anneal. Following treatment with the hydrogen anneal, the width W2 of the treated portions of the silicon including layer 7d is less than the width W3 of the untreated portions of the silicon including layer 7d that are present underling the dielectric spacer 11, as depicted in FIG. 8A. In one embodiment, the width W2 of the treated portions of the silicon including layer that provides the nanowires 7d, in which the width W2 is equal to the diameter of the nanowires 7d, may range from 1 nm to 50 nm. In another embodiment, the width W2 of the treated portions of the silica including layer that provides the nanowires 7d may range from 2 nm to 10 nm. In one embodiment, the width W3 of the untreated portions of the silicon including layer may range from 1 nm to 50 nm. In another embodiment, the width W3 of the untreated portions of the silicon including layer may range from 5 nm to 20 nm. The surface roughness of the elliptical shaped or cylindrical shaped suspended nanowires 7d is reduced as compared to the surface roughness of the remaining portion of the silicon including layer 7 prior to performing the hydrogen anneal. In some embodiments, the hydrogen anneal that is employed in the present disclosure can be performed at a temperature from 600° C. to 1000° C. The pressure of hydrogen used during the hydrogen anneal can range from 5 torr to 600 torr. Although FIGS. 8A-8B depict six suspended nanowires 7d, the present disclosure is not limited to only this embodiment. Any number of nanowires 7d may be formed using the methods and structures provided by the present disclosure. It is noted that the application of the hydrogen anneal that is described with reference to FIGS. 8A to 8B is optional and may be omitted.

Figure 9A:
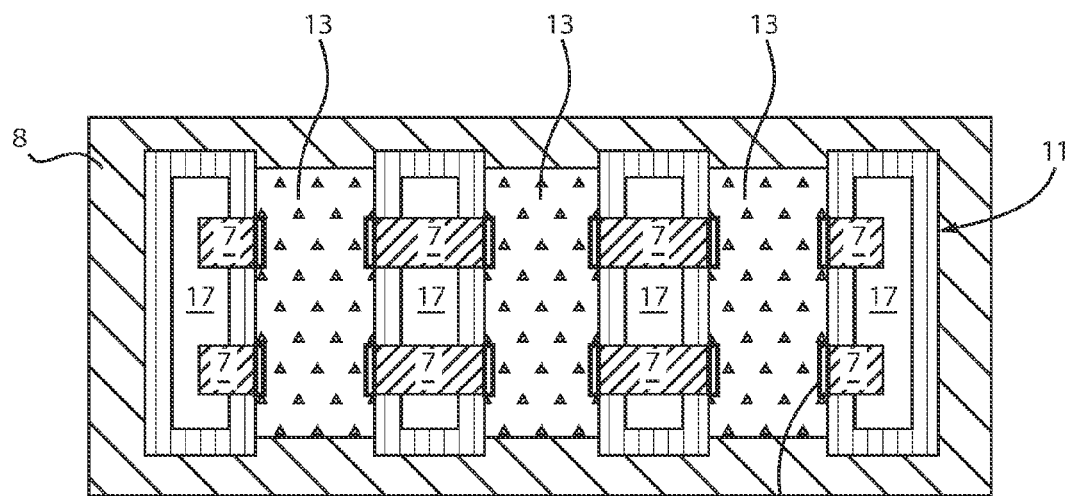
FIG. 9A is a top down view depicting forming a low-k dielectric fill material in the void created by removing the first semiconductor layer, e.g., germanium including layer, of the fin structures depicted in FIG. 8A, in accordance with one embodiment of the present disclosure.
Figure 9B:
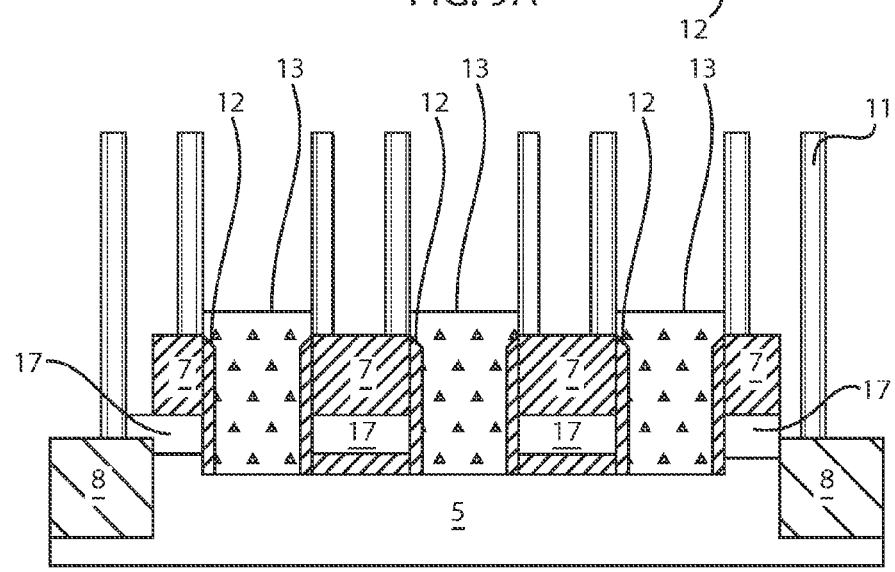
FIG. 9B is a side cross-sectional view of the fin structure that is depicted in FIG. 9A, wherein the cross-section is parallel to the length of the fin structure.
Figure 9C:
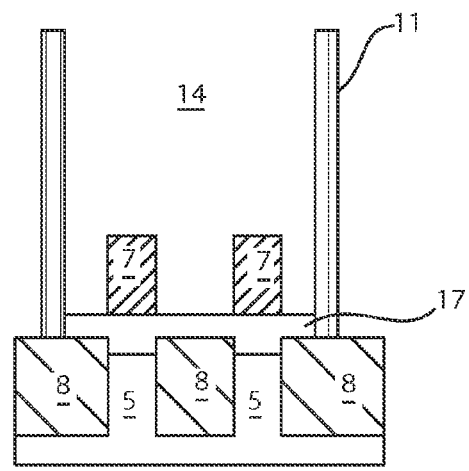
FIG. 9C is aside cross-sectional view of the fin structure that is depicted in FIG. 9A, wherein the cross-section is perpendicular to the length of the fin structure.

FIGS. 9A-9C depict one embodiment of forming a flowable dielectric fill material 17 in the lower portion of the void 16 that is created by removing the germanium including layer 6 of the fin structures 1 depicted in FIGS. 7A-7C. The flowable dielectric fill material 17 may fill the undercut region that is formed by removing the germanium including layer 6. The flowable dielectric fill material 17 may provide a portion of the gate dielectric for the functional gate structure.

The flowable dielectric fill material 17 may be an oxide, such as silicon oxide ($SiO_2$). It is noted that the composition for the flowable dielectric fill material 17 is not limited to only oxides, as other dielectric materials may also be suitable for the flowable dielectric fill material 17. For example, the flowable dielectric fill material 17 may be composed of a low-k dielectric material. In some examples, the low-k dielectric that provides the flowable dielectric fill material 17 may have a dielectric constant of 4.0 or less (measured at room temperature, e.g., 25° C., and 1 atm). For example, a low-k dielectric material suitable for the flowable dielectric fill material 17 may have a dielectric constant ranging from about 1.0 to about 3.0. Examples of low-k materials suitable for the flowable dielectric fill material 17 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The flowable dielectric material 17 is typically formed using spin on glass (SOG) deposition and flowable chemical vapor deposition (FCVD). Spin on glass (SOG) compositions typically includes silicon oxide ($SiO_2$) and optionally dopants (either boron or phosphorous) that is suspended in a solvent solution. The SOG is applied the deposition by spin-coating. Spin-coating is a process used to coat the deposition surface with material which is originally in the liquid form, wherein the liquid is dispensed onto the deposition surface in predetermined amount, and the wafer is rapidly rotated. For example, the deposition surface, e.g., substrate, may be rotated, i.e., spun, to speeds as great as 6000 rpm. During spinning, liquid is uniformly distributed on the surface by centrifugal forces. The deposited material may then be solidified by a low temperature bake, e.g., baking at temperatures less than 200° C.

The flowable dielectric fill material 17 may also be deposited using flowable chemical vapor deposition (FCVD). The flowable dielectric fill material 17 deposited by flowable chemical vapor deposition (FCVD) may be a substantially carbon free silicon oxide ($SiO_2$) material. Flowable chemical vapor deposition (FCVD) provides for a liquid-like film that flows freely into trench like geometries to provide a bottom up, void-free and seam-free fill. Flowable chemical vapor deposition can fill gaps having aspect ratios of up to 30:1. One example, of a flowable chemical vapor deposition process is available from Applied Materials under the tradename Eterna FCVD system.

The flowable dielectric fill material 17 is optional and may be omitted. In the embodiments, in which the flowable dielectric fill material 17 is formed in the bottom portion of the void 16, the flowable dielectric fill material 17 may be in contact with the bottom portion of the remaining portion of the silicon including layer 7 that provides the channel portion of the semiconductor device. In the embodiments, in which the flowable dielectric fill material 17 is removed, the functional gate structure that is formed in the void 16 surrounds the channel portion of the semiconductor device, i.e., the remaining portion of the silicon including layer 7.

Although FIGS. 9A-9C depicts forming a flowable dielectric fill material 17 in the lower portion of the void 16 that is created by removing the germanium including layer 6 of the fin structures 1 depicted in FIGS. 7A-7C it is not intended that the present disclosure be limited to this embodiments. For example, the flowable dielectric fill material 17 may also be formed in the void that is formed by removing the sacrificial gate structure 9 to the nanowires 7d that is depicted in FIGS. 7A-7C.

Figure 10A:
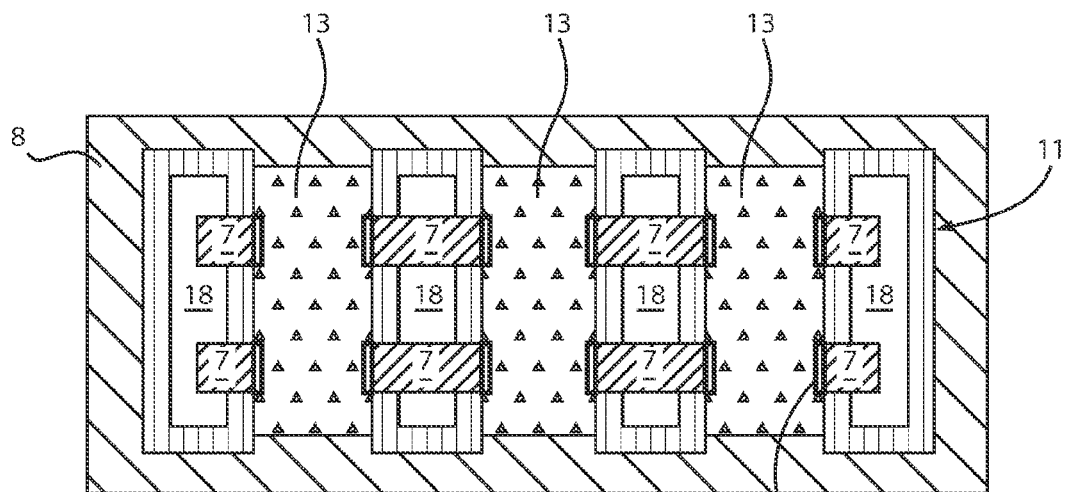
FIG. 10A is a top down view depicting forming a function gate structure by filling the void created by removing the first semiconductor layer, e.g., germanium including layer, of the fin structures depicted in FIG. 7A, in accordance with one embodiment of the present disclosure.
Figure 10B:
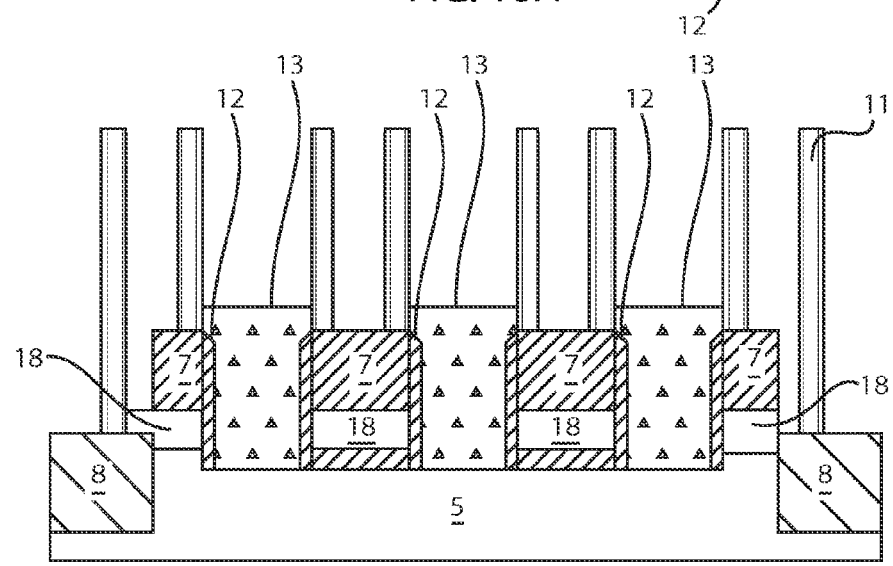
FIG. 10B is a side cross-sectional view of the fin structure that is depicted in FIG. 10A, wherein the cross-section is parallel to the length of the fin structure.
Figure 10C:
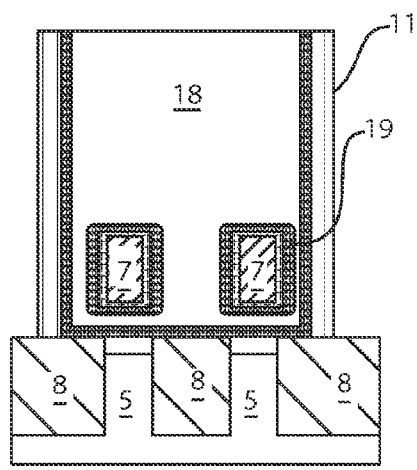
FIG. 10C is a side cross-sectional view of the fin structure that is depicted in FIG. 10A, wherein the cross-section is perpendicular to the length of the fin structure.

FIGS. 10A-10C depicts forming a function gate structure 18 by filling the void 16 created by removing the germanium including layer 6 of the fin structures 1 depicted in FIGS. 7A-7C. The functional gate structure 18 operates to switch the semiconductor device from an "on" to "off" state, and vice versa. More specifically, FIGS. 10A-10C illustrate forming a functional gate structure 18, in which the functional gate structure 18 fully wraps around the silicon including layer 7 that provides the channel region of the semiconductor device. The functional gate structure 18 may be formed by first depositing at least one gate dielectric 19 on the channel region, i.e., including layer 7, of the semiconductor device followed by filling the void 16 with at least one gate conductor 20 that is deposited on the at least one gate dielectric 19. Because the functional gate structure 19 may fully surround the channel region of the device that is provided by the silicon including layer 7, the non-planar semiconductor device of the present disclosure can be referred to as a gate-all-around FET.

The at least gate dielectric 19 may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The at least one gate dielectric 19 can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric 19 can be formed using thermal growth methods, such as oxidation. In one embodiment of the present disclosure, the first dielectric material 28 has a thickness in a range from 1 nm to 10 nm.

The at least one gate conductor 20 that is formed may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor 20 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. In some embodiments, the at least one gate conductor 20 may include a doped semiconductor material, e.g., n-type or p-type doped semiconductor material. For example, the at least one gate conductor 20 may be composed of polysilicon, which can be doped within an appropriate impurity by utilizing either an in-situ doping deposition process or by utilizing deposition, followed by a step, such as ion implantation or gas phase doping, in which the appropriate impurity is introduced into the polysilicon.

In some embodiments, the at least one gate conductor 20 may be composed of an n-type or p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein mea s a shift in the Fermi energy of an n-type semiconductor device towards a conduction band of silicon in a silicon-containing substrate of the n-type semiconductor device. The "conduction band" is the lowest tying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TanN, TiN, HfN, HfSi, or combinations thereof.

Figure 10D:
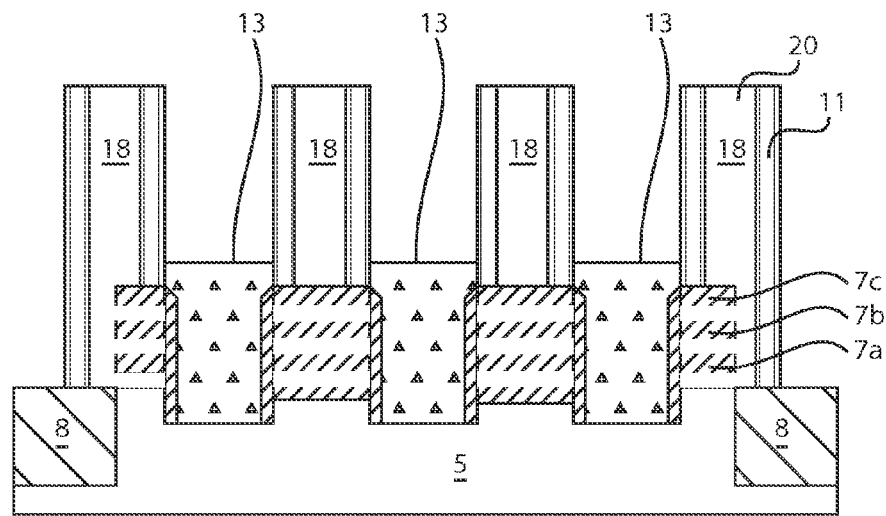
FIG. 10D is a side cross-sectional view of forming a function gate structure by filling the void created by removing the first semiconductor layer, e.g., germanium including layer, of the fin structures, wherein the gate structure is formed on multiple semiconductor layers having the composition of the first semiconductor layer, e.g., germanium including layer, and the second semiconductor layer, silicon including layer, that is depicted in FIG. 1B, accordance with one embodiment of the present disclosure
Figure 10E:
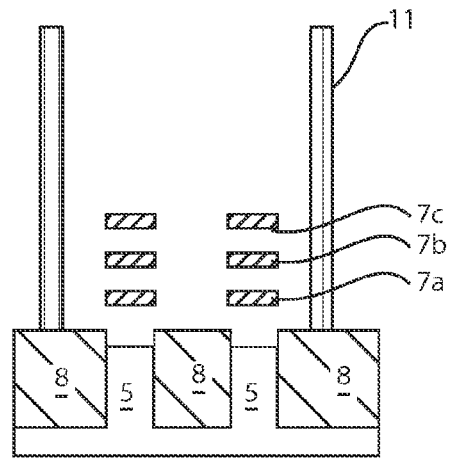
FIG. 10E is a side cross-sectional view of the fin structure that is depicted in FIG. 10D, wherein the cross-section is parallel to the length of the fin structure.

FIGS. 10D and 10E depict forming a function gate structure 18 by filling the void 16 created by removing the silicon and germanium including layer of the fin structures 1, wherein the functional gate structure 18 is formed on multiple silicon containing layers 7a, 7b, 7c that is provided by the stack of multiple silicon including layers 7a, 7b, 7c and multiple germanium including layers 6a, 6b, 6c that is depicted in FIG. 1B.

Figure 10F:
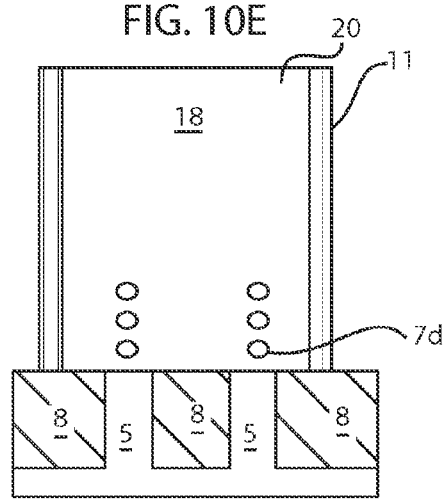
FIG. 10F is a side cross-sectional view depicting of the structure depicted in FIG. 10E after etching the plurality of fin structures to provide nanowires.

FIG. 10F depicts forming a function gate structure 18 by filling the void created by removing the germanium including layer of the fin structures, wherein the functional gate structure 18 is formed on multiple silicon containing layers that have been processed to provide nanowires 7d as depicted in FIGS. 8A-8C.

Figure 10G:
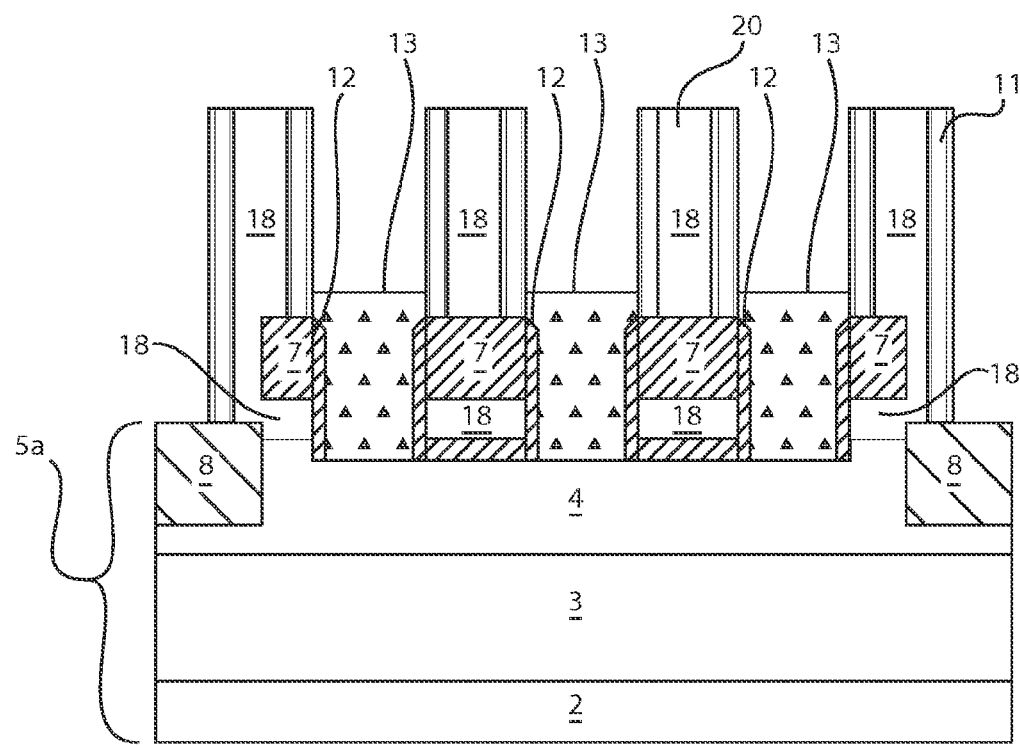
FIG. 10G is a side cross-sectional view of the fin structure that is parallel to the length of the fin structure depicting forming a function gate structure by filling the void created by removing the first semiconductor layer, e.g., germanium including layer, of the fin structure, wherein the structure is formed on a semiconductor on insulator (SOI) substrate, in accordance with one embodiment of the present disclosure.
Figure 10H:
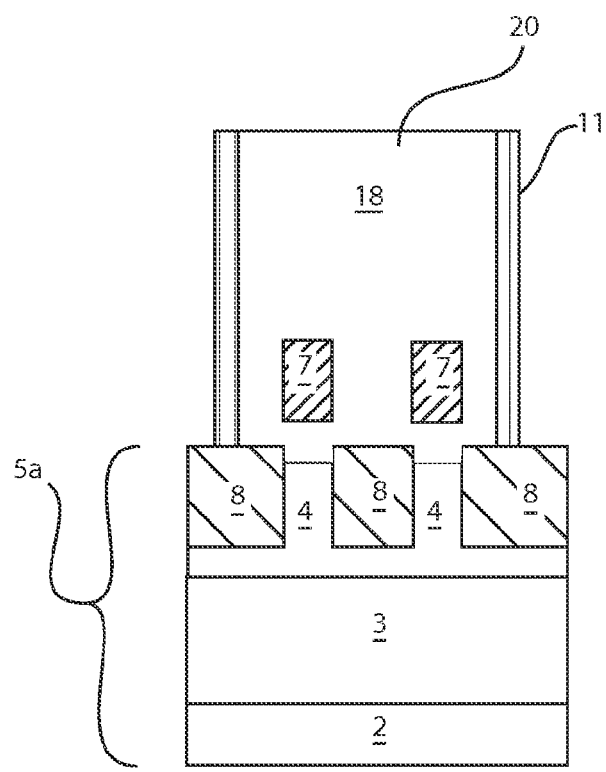
FIG. 10H is a side cross-sectional view of the fin structure that is depicted in FIG. 10G, wherein the cross-section is parallel to the length of the fin structure.

FIGS. 10G and 10H depicts forming a function gate structure 18 on the suspended remaining portions of silicon including layer 7 that are formed on a semiconductor on insulator (SOI) substrate 5a.

Figure 10I:
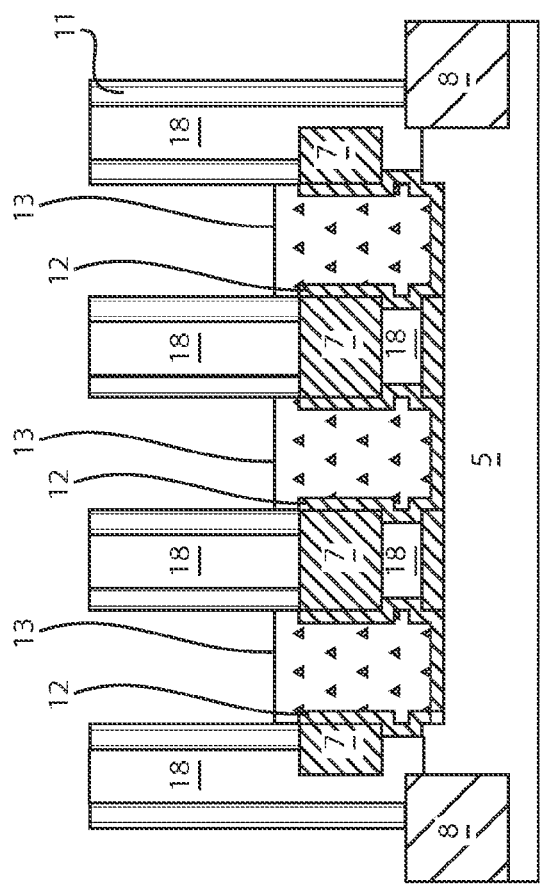
FIG. 10I is a side cross-sectional view of the fin structure that is parallel to the length of the fin structure depicting forming a functional gate structure on the suspended remaining portions of the second semiconductor layer, e.g., silicon including layer, that have been laterally etched, in accordance with another embodiment of the present disclosure.

FIG. 10I depicts forming a functional gate structure 18 on suspended remaining portions of the silicon including layer 7 that have been laterally etched as described above with reference to FIG. 5D. In this embodiment, when the epitaxial merges structures 13 are composed of a strain inducing material, the increased volume of the epitaxial merge structures 13 that is present adjacent to the notched regions of the silicon including layer 7 produces an increased strain on the channel region of the semiconductor device.

Figure 11:
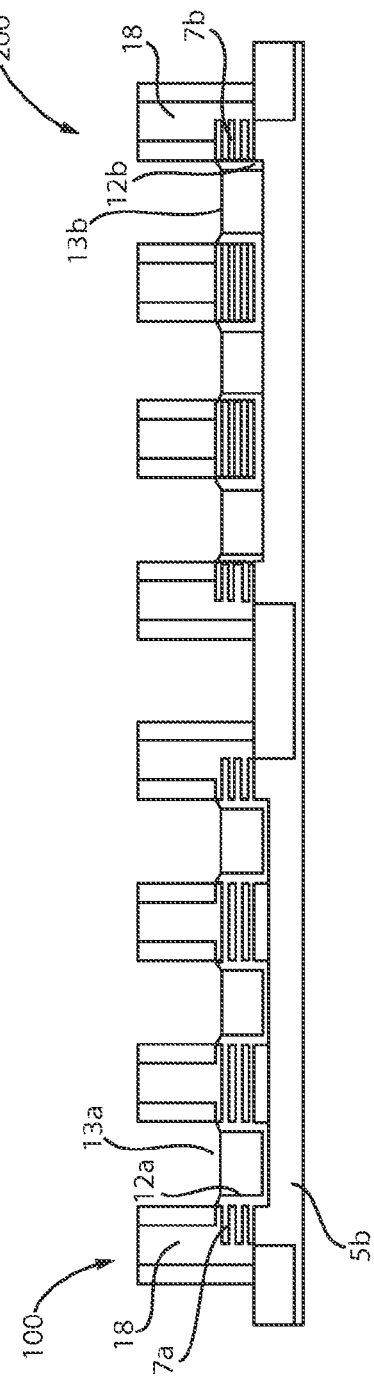
FIG. 11 is a side cross-sectional view of the fin structures that are parallel to the length of the fin structures depicting forming n-type FinFETs on a first portion of a semiconductor substrate, and forming p-type FinFETs on a second portion of the semiconductor substrate.

FIG. 11 depicts p-type FinFET semiconductor devices 100 and n-type FinFET 200 semiconductor devices that are formed on the same semiconductor substrate. In one example, the p-type FinFET semiconductor devices 100 include a cladding layer 12a composed of silicon, e.g., 100 wt. % silicon, and epitaxial merge structures 13a composed of compressive strain inducing silicon germanium (SiGe). The epitaxial merge structures 13a provide the source and drain regions of the semiconductor device. The channel region 7a of the p-type FinFET 100 may be composed of silicon, e.g., 100 wt. % silicon. The channel region 7a of the p-type FinFET 100 may be suspended with a wrap-around functional gate structure 18, as described above with reference to FIGS. 1A-10I. To provide the suspended channel regions 7a, a stacked structure of at least one silicon including layer and at least one germanium including layer was used to provide the fin structures, wherein the at least one germanium including layer was removed selectively to the silicon including layer of the fin structures and the silicon cladding layer. This method has been described in more detail with reference to FIGS. 1A-10I.

The n-type FinFET 200 semiconductor devices that are formed on the same semiconductor substrate as the p-type FinFET 100 include a cladding layer 12b composed of silicon germanium (SiGe), and epitaxial merge structures 13b composed of at least one of silicon (Si), silicon doped with phosphorus (SiP), and silicon doped with phosphorus and carbon (SiCP). The epitaxial merge structures 13b provide the source and drain regions of the semiconductor device and are composed of tensile strain inducing materials. The channel region 7b of the n-type FinFET 200 may be composed of germanium, e.g., 100 wt. % germanium. The channel region 7b of the n-type FinFET 200 may be suspended with a wrap-around functional gate structure 18, as described above with reference to FIGS. 1A-10I. To provide the suspended channel regions 7b of germanium, a stacked structure of at least one germanium including layer and at least one silicon including layer was used to provide the fin structures, wherein the at least one silicon including layer was removed selectively to the germanium including layer (which provides the channel region 7b) of the fin structures and the silicon germanium cladding layer 12b. The germanium including layer 7b is similar to the silicon including layer 7 that has been described above with reference to FIGS. 1A-10I.

The portions of the substrate 5b containing the n-type FinFETs 200 and the p-type FinFETs 100 may be independently processed using Hock masks. More specifically, in one example, a first block mask (not shown) may be formed overlying the portion of the substrate in which the n-type FinFETs 200 are present, while the p-type FinFETs 100 are processed to provide the suspended channel regions. The block masks may comprise soft and/or hardmask materials and can be formed using deposition, photolithography and etching. In one embodiment, the block mask comprises a photoresist. Thereafter, the first block mask is removed, and a second block mask may be formed overlying the portion of the substrate in which the p-type FinFETs 100 are present. The exposed portion of the substrate that includes the n-type FinFETs 200 may then be processed to provide the suspended channel regions, while the p-type FinFETS 100 are protected by the second block mask.

Methods as described herein may be used in the fabrication of integrated circuit chips. The resulting integrated circuit chips can be distributed by the fabricator in raw water form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a gate structure present on at least one suspended channel structure, wherein at least one gate dielectric layer is present surrounding, and in contact with, the at least one suspended channel structure and at least one gate conductor is present on the at least one gate dielectric layer; and
   source and drain structures comprised of a strain inducing material, wherein the source and drain structures are in contact with the source and drain region ends of the suspended channel structure through a semiconductor cladding layer formed on sidewalls of the source and drain ends of the suspended channel structure, wherein a lattice dimension of the strain inducing material is different from a lattice dimension of the semiconductor cladding layer.

2. The semiconductor device of claim 1, wherein the at least one suspended channel structure includes multiple suspended channel structures.

3. The semiconductor device of claim 1, wherein the at least one suspended channel structure has an oblong geometry.

4. The semiconductor device of claim 1, w herein the suspended channel structure is composed of intrinsic silicon, the source and drain structures are composed of silicon germanium doped with an n-type or p-type dopant, and the semiconductor cladding layer is composed of intrinsic silicon.

5. The semiconductor device of claim 1, wherein the semiconductor cladding layer includes a crystalline crystal structure oriented to a crystal arrangement of an underlying semiconductor material, and wherein the semiconductor cladding layer conformally contacts the sidewalls of the source and drain ends of the suspended channel structure in addition to an upper surface of the underlying semiconductor material.

6. The semiconductor device of claim 1, wherein the lattice dimension of the strain inducing material is less than the lattice dimension of the semiconductor cladding layer, such that the source and drain structures induce a tensile strain on the suspended channel structure.

7. The semiconductor device of claim 1, wherein the lattice dimension of the strain inducing material is greater than the lattice dimension of the semiconductor cladding layer, such that the source and drain structures induce a compressive strain on the suspended channel structure.

8. A semiconductor device comprising:
   a gate structure present on at least one nanowire channel structure, wherein at least one gate dielectric layer is present surrounding, and in contact with, the at least one nanowire channel, and at least one gate conductor is present on the at least one gate dielectric layer; and
   epitaxial source and drain structures comprised of a strain inducing material, the epitaxial source and drain structures in contact with the source and drain region ends of the plurality of the suspended nanowire structures through a semiconductor cladding layer formed on sidewalls of the source and drain region ends of each of the plurality of suspended nanowire structures, wherein a lattice dimension of the strain inducing material is different from a lattice dimension of the semiconductor cladding layer, such that the epitaxial source and drain structures induce one of a compressive strain or a tensile strain on the at least one nanowire channel through the silicon cladding region.

9. The semiconductor device of claim 8, wherein the at least one suspended nanowire structure includes multiple suspended channel structures.

10. The semiconductor device of claim 8, wherein the at least one suspended nanowire has an oblong geometry.

11. The semiconductor device of claim 8, wherein the silicon cladding region includes a crystalline crystal structure oriented to a crystal arrangement of an underlying semiconductor material, and wherein the semiconductor cladding layer conformally contacts the sidewalls of the source and drain ends of the plurality of the suspended nanowire structures in addition to an upper surface of the underlying semiconductor material.

12. The semiconductor device of claim 8, wherein the lattice dimension of the strain inducing material is less than the lattice dimension of the silicon cladding region, such that the epitaxial source and drain structures induce the tensile strain on the plurality of the at least one nanowire channel.

13. The semiconductor device of claim 8, wherein the lattice dimension of the strain inducing material is greater than the lattice dimension of the silicon cladding region, such that the epitaxial source and drain structures induce the compressive strain on the at least one nanowire channel.

* * * * *